(12) United States Patent
Kaufman-Osborn et al.

(10) Patent No.: US 11,725,274 B2
(45) Date of Patent: Aug. 15, 2023

(54) INTEGRATED CLUSTER TOOL FOR SELECTIVE AREA DEPOSITION

(71) Applicant: Applied Materials, Inc., Santa Clara, CA (US)

(72) Inventors: Tobin Kaufman-Osborn, Sunnyvale, CA (US); Srinivas D. Nemani, Sunnyvale, CA (US); Ludovic Godet, Sunnyvale, CA (US); Qiwei Liang, Fremont, CA (US); Adib Khan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 6 days.

(21) Appl. No.: 16/433,064

(22) Filed: Jun. 6, 2019

(65) Prior Publication Data

US 2019/0301009 A1    Oct. 3, 2019

Related U.S. Application Data

(62) Division of application No. 15/173,356, filed on Jun. 3, 2016, now Pat. No. 10,358,715.

(51) Int. Cl.
*C23C 16/02* (2006.01)
*C23C 16/04* (2006.01)
(Continued)

(52) U.S. Cl.
CPC ............ *C23C 16/042* (2013.01); *C23C 16/02* (2013.01); *C23C 16/45502* (2013.01);
(Continued)

(58) Field of Classification Search
None
See application file for complete search history.

(56) References Cited

U.S. PATENT DOCUMENTS

| 6,200,893 B1 | 3/2001 | Sneh |
| 6,391,785 B1 | 5/2002 | Satta et al. |

(Continued)

FOREIGN PATENT DOCUMENTS

| CN | 104040708 A | 9/2014 |
| EP | 1202321 A2 | 5/2002 |

(Continued)

OTHER PUBLICATIONS

Hong et al. ALD Resist Formed by Vapor-Deposited Self-Assembled Monolayers. Langmuir 2007, 23, 1160-1165 (Year: 2007).*

(Continued)

*Primary Examiner* — David P Turocy
(74) *Attorney, Agent, or Firm* — Patterson + Sheridan, LLP

(57) ABSTRACT

Embodiments described herein relate to apparatus and methods for processing a substrate. In one embodiment, a cluster tool apparatus is provided having a transfer chamber and a pre-clean chamber, a self-assembled monolayer (SAM) deposition chamber, an atomic layer deposition (ALD) chamber, and a post-processing chamber disposed about the transfer chamber. A substrate may be processed by the cluster tool and transferred between the pre-clean chamber, the SAM deposition chamber, the ALD chamber, and the post-processing chamber. Transfer of the substrate between each of the chambers may be facilitated by the transfer chamber which houses a transfer robot.

21 Claims, 8 Drawing Sheets

(51) Int. Cl.

| | |
|---|---|
| *H01L 21/67* | (2006.01) |
| *H01L 21/687* | (2006.01) |
| *C23C 16/455* | (2006.01) |
| *C23C 16/54* | (2006.01) |
| *C23C 16/56* | (2006.01) |
| *H01L 21/02* | (2006.01) |
| *H01J 37/32* | (2006.01) |
| *H01L 21/677* | (2006.01) |
| *H01L 21/8234* | (2006.01) |

(52) U.S. Cl.
CPC .. *C23C 16/45544* (2013.01); *C23C 16/45561* (2013.01); *C23C 16/45582* (2013.01); *C23C 16/54* (2013.01); *C23C 16/56* (2013.01); *H01J 37/32357* (2013.01); *H01J 37/32724* (2013.01); *H01J 37/32733* (2013.01); *H01J 37/32899* (2013.01); *H01L 21/0228* (2013.01); *H01L 21/02263* (2013.01); *H01L 21/02299* (2013.01); *H01L 21/02304* (2013.01); *H01L 21/6719* (2013.01); *H01L 21/67069* (2013.01); *H01L 21/67103* (2013.01); *H01L 21/67109* (2013.01); *H01L 21/67167* (2013.01); *H01L 21/67196* (2013.01); *H01L 21/67207* (2013.01); *H01L 21/67742* (2013.01); *H01L 21/67748* (2013.01); *H01L 21/67754* (2013.01); *H01L 21/68785* (2013.01); *H01J 2237/327* (2013.01); *H01J 2237/334* (2013.01); *H01L 21/823431* (2013.01)

(56) References Cited

U.S. PATENT DOCUMENTS

| | | | |
|---|---|---|---|
| 7,071,022 B2 | 7/2006 | Couillard et al. | |
| 7,648,866 B2 | 1/2010 | Jung et al. | |
| 7,775,508 B2 | 8/2010 | Choi et al. | |
| 7,960,295 B2 | 6/2011 | Park | |
| 7,993,458 B2 | 8/2011 | Kondo et al. | |
| 8,506,754 B2* | 8/2013 | Moshtagh | C23C 16/4412 156/345.33 |
| 8,992,685 B2 | 3/2015 | Kato et al. | |
| 9,112,003 B2 | 8/2015 | Haukka et al. | |
| 9,502,289 B2 | 11/2016 | Haukka et al. | |
| 2001/0035127 A1 | 11/2001 | Metzner et al. | |
| 2003/0101938 A1 | 6/2003 | Ronsse et al. | |
| 2004/0221807 A1 | 11/2004 | Verghese et al. | |
| 2006/0051940 A1* | 3/2006 | Todd | H01L 21/02535 427/248.1 |
| 2006/0060301 A1 | 3/2006 | Lazovsky et al. | |
| 2007/0102119 A1 | 5/2007 | Ikeda | |
| 2008/0026146 A1 | 1/2008 | Kobrin et al. | |
| 2008/0044569 A1 | 2/2008 | Myo et al. | |
| 2008/0069955 A1* | 3/2008 | Hong | C23C 16/045 118/728 |
| 2008/0274282 A1 | 11/2008 | Bent et al. | |
| 2008/0276860 A1* | 11/2008 | Burrows | C23C 16/303 117/88 |
| 2009/0004850 A1 | 1/2009 | Ganguli et al. | |
| 2009/0057266 A1 | 3/2009 | Tuncel et al. | |
| 2011/0124187 A1 | 5/2011 | Afzali-Ardakani et al. | |
| 2011/0198736 A1* | 8/2011 | Shero | H01L 29/517 427/255.6 |
| 2011/0253044 A1 | 10/2011 | Tam et al. | |
| 2012/1009765 | 1/2012 | Olgado | |
| 2012/0178650 A1 | 7/2012 | Carroll et al. | |
| 2012/0238109 A1 | 9/2012 | Hattori et al. | |
| 2013/0129922 A1 | 5/2013 | Sasagawa et al. | |
| 2013/0193108 A1 | 8/2013 | Zheng et al. | |
| 2013/0196502 A1* | 8/2013 | Haukka | H01L 21/76849 438/653 |
| 2014/0357016 A1 | 12/2014 | Fuse | |
| 2014/0370718 A1 | 12/2014 | Chakrapani et al. | |
| 2015/0090330 A1 | 4/2015 | Sewell et al. | |
| 2015/0147879 A1* | 5/2015 | Chatterjee | H01L 23/53238 438/653 |
| 2015/0179500 A1 | 6/2015 | Boussie et al. | |
| 2015/0217330 A1* | 8/2015 | Haukka | C23C 18/1208 427/343 |
| 2015/0299848 A1* | 10/2015 | Haukka | C23C 16/402 427/256 |
| 2016/0056071 A1 | 2/2016 | Draeger et al. | |
| 2016/0104648 A1 | 4/2016 | Park et al. | |
| 2016/0148839 A1* | 5/2016 | Abelson | C23C 16/18 438/608 |
| 2017/0141295 A1* | 5/2017 | Ekerdt | C23C 16/0272 |
| 2017/0323776 A1* | 11/2017 | Färm | H01L 21/32 |

FOREIGN PATENT DOCUMENTS

| | | | |
|---|---|---|---|
| JP | H08-148480 A | 6/1996 | |
| JP | 2002-237486 A | 8/2002 | |
| JP | 2007-186757 A | 7/2007 | |
| JP | 2010-245449 A | 10/2010 | |
| JP | 2013520028 A | 5/2013 | |
| JP | 2013-154315 A | 8/2013 | |
| JP | 2013-161913 A | 8/2013 | |
| JP | 2014531508 A | 11/2014 | |
| KR | 10-2010-0107228 | 10/2010 | |
| KR | 2011-0014771 A | 2/2011 | |
| KR | 10-2013-0005262 A | 1/2013 | |
| WO | WO-2010098875 A2 * | 9/2010 | ......... C23C 16/4401 |
| WO | 2011103062 A2 | 8/2011 | |
| WO | 2013030576 A1 | 3/2013 | |

OTHER PUBLICATIONS

Extended European Search Report for European Application No. 17790059.4 dated Mar. 19, 2020.

Final Office Action for Korean Application No. 10-2018-7033883 dated Jun. 17, 2020.

T. M. Mayer, et al., Chemical Vapor Deposition of Fluoroalkylsilane Monolayer Films; for Adhesion Control in Microelectromechanical Systems, Journal of Vacuum Science & Technology B, 18 (5), Sep./Oct. 2000, 9 pp.

Elina Färm, et al., Self-Assembled Octadecyltrimethoxysilane Monolayers Enabling Selective-Area Atomic Layer Deposition of Iridium, Chemical Vapor Deposition, 12, 2006, 3 pp.

Junsic Hong, et al., ALD Resist Formed by Vapor-Deposited Self-Assembled Monolayers, Langmuir 2007, 23, 6 pp.

Satu Ek, et al., Atomic Layer Deposition of a High-Density Aminopropylsiloxane Network on Silica through Sequential Reactions of ?-Aminopropyltrialkoxysilanes and Water, Langmuir 2003, 19, 9 pp.

Hashemi et al., Self Correcting Process for High Quality Patterning by Atomic Layer Deposition, American Chemical Society, Jul. 16, 2015.

Elina Farm, Selective-Area Atomic Layer Depositiion, University of Helsinki, Nov. 2011.

International Search Report and Written Opinion for International Application No. PCT/US2017/019982 dated Jun. 26, 2017.

Se Kirkwood et al., Mechanism for femtosecond laser pulse patterning of SAM on gold coated substrate, IOP Publishing Ltd 2007 p. 428-430.

Ming Fang, et al., Area-Selective Atomic Layer Deposition: Conformal Coating, Subnanometer Thickness Control and Smart Positioning, ACS Nano 2015 Vol. 9. No. 9 pp. 8651-8654.

Non-final Office Action in U.S. Appl. No. 10/731,656 dated May 11, 2004.

European Office Action in application EP 00955875.0. dated May 8, 2004.

JW Klaus et al., Atomically controlled growth of tungsten and tungsten nitride using sequential surface reactions; Applied Surface Sciences 162-163 (2000) 479-491.

Mikko Ritala et al., Atomic layer epitaxy—a valuable tool for nanotechnology?; Nanotechnology 10 (1999) 19-24 printed in the UK.

(56) References Cited

OTHER PUBLICATIONS

Per Martensson et al., Atomic Layer Epitaxy of Copper, J. Electrochem. Soc., vol. 145, No. 8, Aug. 1998 The Electrochemical Society, Inc. pp. 2926-2931.

Shin Yokoyama, et al., Atomic-layer selective deposition of silicon nitride on hydrogen-terminated Si surfaces, Applied Surface Science 130-132 1998. 352-356.

Stephen M. Gates, Surface Chemistry in the Chemical Vapor Deposition of Electronic Materials, Chem. Rev. 1996, 96, pp. 1519-1532.

A. Jain et al., Control of selectivity during chemical vapor deposition of copper from copper (I) compounds via silicon dioxide surface modification, Applied Physics Letters 61, pp. 2662-2664 (1992) American Institute of Physics.

M. Leskela et al., ALD precursor chemistry: Evolution and future challenges, Article published online by EDP Sciences and available at http://dx.doi.org/10.1051/jp4:19998106.

Jae-Sik Min et al., Metal-organic atomic-layer deposition of titanium-silicon-nitride films. Applied Physics Letters vol. 75, No. 11 Sep. 13, 1999.

Mikko Ritala et al., Perfectly Conformal TiN and Al2O3 Films Deposited by Atomic Layer Deposition, Chemical Vapor Deposition 1999, 5, No. 1 Ó WILEY-VCH Verlag GmbH, D-69469 Weinheim, 1999.

International Search Report and Written Opinion of related application PCT/US2017/024077 dated Jul. 11, 2017.

Woo-Hee Kim, et al., A Process for Topographically-Selective Deposition on 3D Nanostructures by Ion Implantation, ACS Nano, 2016, 10 (4), 22 pp.

Communication pursuant to Rule 164(1) EPC for Application No. 17790059.4—1103/3449500 dated Dec. 9, 2019.

Office Action for Korean Application No. 10-2018-7028591 dated Dec. 12, 2019.

Office Action for Japanese Application No. 2018-546484 dated Oct. 8, 2019.

Office Action for Japanese Application No. 2017-109760 dated Jun. 22, 2021.

Office Action for Korean Application No. 10-2017-0068956 dated Aug. 31, 2021.

Japanese Office Action dated Apr. 5, 2022 for Application No. 2017-109760.

Office Action for Chinese Application No. 201710364977.5 dated Oct. 31, 2022.

Search Report for Chinese Application No. 201710364977.5 dated Oct. 21, 2022.

\* cited by examiner

INTEGRATED CLUSTER TOOL FOR SELECTIVE AREA DEPOSITION

CROSS-REFERENCE TO RELATED APPLICATION

This application is a divisional application of U.S. patent application Ser. No. 15/173,356, filed Jun. 3, 2016, which is incorporated by reference herein.

BACKGROUND

Field

Embodiments of the present disclosure generally relate to apparatus for processing substrates. More specifically, embodiments described herein relate to an integrated cluster tool for selective area deposition.

Description of the Related Art

Reliably producing sub-half micron and smaller features is one of the key technology challenges for next generation very large scale integration (VLSI) and ultra large scale integration (ULSI) of semiconductor devices. However, as the limits of circuit technology are pushed, the shrinking dimensions of VLSI and ULSI technology have placed additional demands on processing capabilities.

As circuit densities increase for next generation devices, the widths of interconnects, such as vias, trenches, contacts, gate structures and other features, as well as the dielectric materials therebetween, decrease to 45 nm and 32 nm dimensions and beyond. In order to enable the fabrication of next generation devices and structures, three dimensional (3D) stacking of features in semiconductor chips is often utilized. In particular, fin field effect transistors (FinFETs) are often utilized to form three dimensional (3D) structures in semiconductor chips. By arranging transistors in three dimensions instead of conventional two dimensions, multiple transistors may be placed in the integrated circuits (ICs) very close to each other. As circuit densities and stacking increase, the ability to selectively deposit subsequent materials on previously deposited materials gains importance.

Self-assembled monolayers (SAMs) may be utilized as a masking material to improve subsequent material deposition selectivity. SAMs are generally surface chemistry dependent and can be formed preferentially on various materials. However, current apparatus for depositing SAMs often suffers from slow deposition rates which undesirably decreases throughput. In addition, SAM apparatus integration with pre and post processing apparatus which provides suitable throughput is lacking in the industry.

Thus, what is needed in the art are improved substrate processing apparatus and methods.

SUMMARY

In one embodiment, a substrate processing apparatus is provided. The apparatus includes a platform having a centrally disposed transfer chamber and a first process chamber coupled to the transfer chamber. The first process chamber is configured to perform an etching process. A second process chamber is coupled to the transfer chamber and the second process chamber is configured to perform a self-assembled monolayer treatment process. A third process chamber is coupled to the transfer chamber and the third process chamber is configured to perform an atomic layer deposition process. A fourth process chamber is coupled to the transfer chamber and the fourth process chamber is configured to perform an anneal process.

In another embodiment, a substrate processing apparatus is provided. The apparatus includes a platform having a centrally disposed transfer chamber and a first process chamber coupled to the transfer chamber. The first process chamber is configured to perform an etching process. A second process chamber is coupled to the transfer chamber adjacent the first process chamber and the second process chamber is configured to perform a self-assembled monolayer treatment process. A third process chamber is coupled to the transfer chamber adjacent the second process chamber and the third process chamber is configured to perform an atomic layer deposition process. A fourth process chamber is coupled to the transfer chamber adjacent the third process chamber and the fourth process chamber is configured to perform an anneal process.

In yet another embodiment, a substrate processing method is provided. The method includes transferring a substrate to a first process chamber and performing an etching process on the substrate in the first process chamber. The substrate is transferred from the first process chamber to a second process chamber via a transfer chamber and a self-assembled monolayer treatment process is performed on the substrate in the second process chamber. The substrate is transferred from the second process chamber to a third process chamber via the transfer chamber and an atomic layer deposition process is performed on the substrate in the third process chamber. The substrate is transferred from the third process chamber to a fourth process chamber via the transfer chamber and an anneal process is performed on the substrate in the fourth process chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to apparatus and methods for processing a substrate. In one embodiment, a cluster tool apparatus is provided having a transfer chamber and a pre-clean chamber, a self-assembled monolayer (SAM) deposition chamber, an atomic layer deposition (ALD) chamber, and a post-processing chamber disposed about the transfer chamber. A substrate may be processed by the cluster tool and transferred between the pre-clean chamber, the SAM deposition chamber, the ALD chamber, and the post-processing chamber. Transfer of the substrate between each of the chambers may be facilitated by the transfer chamber which houses a transfer robot.

As utilized herein, "self-assembled monolayer" (SAM) generally refers to a layer of molecules that are attached (e.g., by a chemical bond) to a surface and that have adopted a preferred orientation with respect to that surface and even with respect to each other. The SAM typically includes an organized layer of amphiphilic molecules in which one end of the molecule, the "head group" shows a specific, reversible affinity for a substrate. Selection of the head group will depend on the application of the SAM, with the type of SAM compounds based on the substrate utilized. Generally, the head group is connected to an alkyl chain in which a tail or "terminal end" can be functionalized, for example, to vary wetting and interfacial properties. The molecules that form the SAM will selectively attach to one material over another material (e.g., metal vs. dielectric) and if of sufficient density, can successfully operation subsequent deposition allowing for selective deposition on materials not coated with the SAM.

Figure 1:
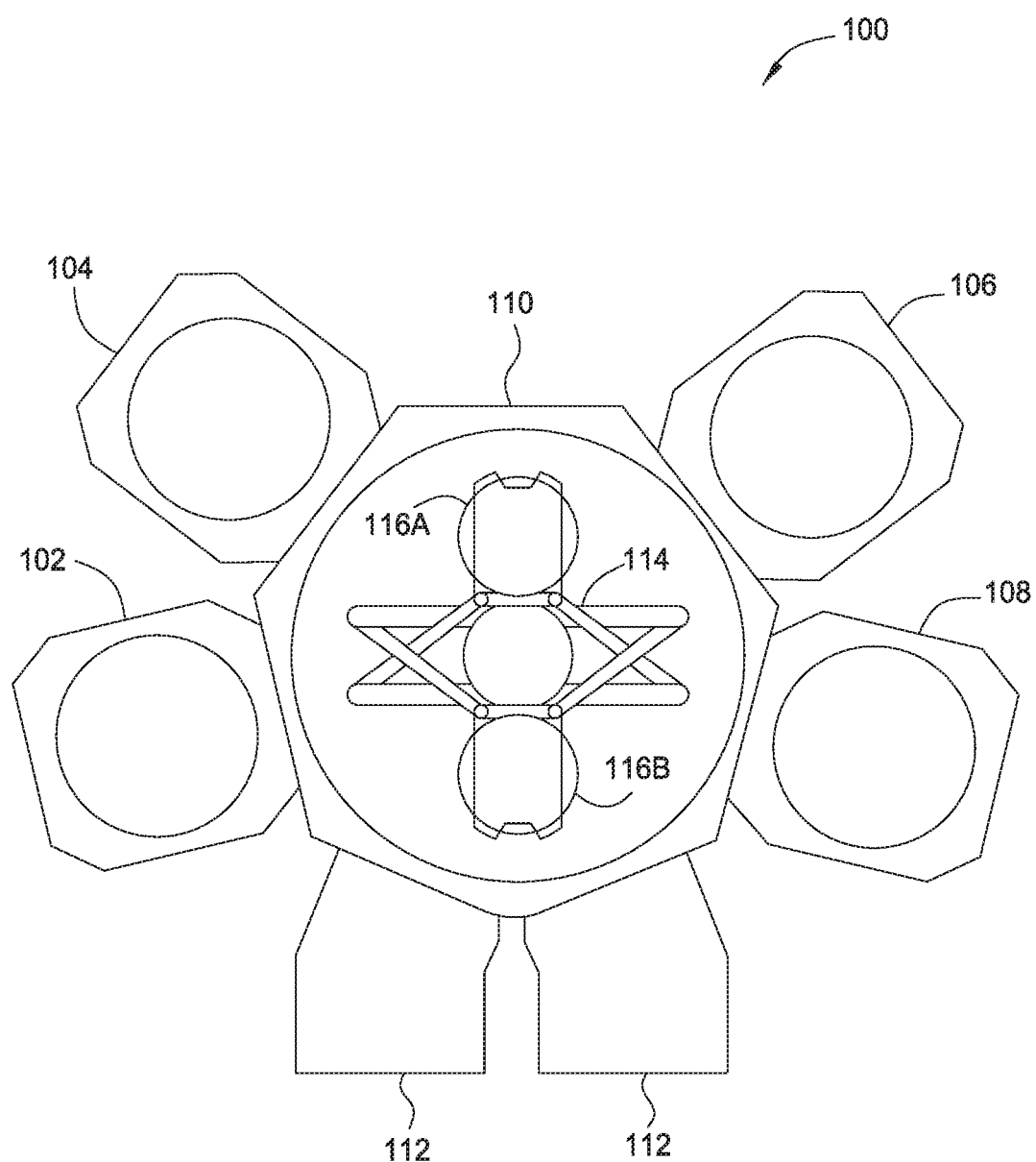
FIG. 1 illustrates a schematic, plan view of a cluster tool apparatus according to one embodiment described herein.

FIG. 1 illustrates a schematic, plan view of a cluster tool apparatus 100 according to one embodiment described herein. Examples of suitable apparatus which may be utilized in accordance with the embodiments described herein include the CENTURA® and ENDURA® platforms, both of which are available from Applied Materials, Inc., Santa Clara, Calif. It is contemplated that other suitably configured apparatus from other manufacturers may also be advantageously utilized in accordance with the embodiments described herein. In addition, the PRODUCER® platform, also available from Applied Materials, Inc., Santa Clara, Calif., having dual-chamber capability may be advantageously employed according to the embodiments described herein. In embodiments utilizing the PRODUCER® platform, load lock chambers with bake or anneal capability may be employed as post processing chambers in accordance with the embodiments described hereinafter.

Generally, the apparatus 100 includes a plurality of process chambers 102, 104, 106, 108, a transfer chamber 110, and load lock chambers 112. Each of the process chambers 102, 104, 106, 108 are coupled to the transfer chamber 110. In one embodiment, the process chamber 104 is disposed adjacent the process chamber 102. In one embodiment, the process chamber 106 is disposed adjacent the process chamber 104. In one embodiment, the process chamber 108 is disposed adjacent the process chamber 106. Each process chamber represents, and may be used for, a different stage or phase of substrate processing. In one embodiment, the process chamber 102 is a pre-clean chamber. The process chamber 102 prepares surfaces of a substrate being processed for subsequent processing. In various examples, the process chamber 102 may remove substrate defects which result from air exposure, remove native oxide layers, and/or remove sacrificial layers disposed on a surface of the substrate to be treated by SAM or ALD processing. In another example, the process chamber 102 is utilized for substrate surface functionalization. In this example, surface terminal groups may be modified to enable, assist, or prevent the formation of a SAM on the substrate, depending upon the desired implementation.

Specific examples of surface treatment which may be performed by the process chamber 102 include metal oxide removal via plasma treatment, surface hydroxyl functionalization using $H_2/O_2$ plasma treatment or water vapor exposure, and/or oxide removal using a SICONI® process or a FRONTIER process. The SICONI® process and FRONTIER process are available from Applied Materials, Inc., Santa Clara, Calif. It is contemplated that other similar treatment processes may be utilized in accordance with the embodiments described herein. More specifically, the process chamber 102 is utilized to enable selective area SAM adsorption. For example, an octadecyltrichlorosilane (OD-TCS) SAM may bond to a dielectric or metal oxide material preferentially to a metal or Si—H terminated surface, assuming desirable conditions are present. The process chamber 102 is utilized to remove the metal oxide or native oxide to form an exposed metal surface of Si—H terminated surface which generally prohibits SAM adsorption.

In another embodiment, the process chamber 102 may be utilized as a post-process chamber. The process chamber 102, which is described in greater detail with regard to FIG. 2, includes a heated pedestal which is utilized to perform a bake or anneal process. The bake or anneal process may be utilized after the substrate has been processed by other chambers of the apparatus 100.

In one embodiment, the process chamber 104 is a SAM deposition chamber. The process chamber 104 is configured to enable vapor phase SAM molecules to selectively adsorb to one material of a substrate preferentially to another material of the substrate. The selective adsorption is generally controlled by the reactivity of the SAM molecule headgroup and the surface termination characteristics/functional groups disposed on the substrate surface. For example, a substrate having exposed $SiO_2$ and Cu materials which are exposed to the same SAM treatment process will result in the SAM molecules selective to metals bonding to the Cu preferentially and substantially no adsorption on the $SiO_2$ material. The resulting SAM material has a high water contact angle (i.e. greater than about 105°) which indicates the formation of a dense SAM. Thus, the process chamber 104 is utilized to perform SAM deposition processes.

In one embodiment, the process chamber 106 is an ALD chamber. The process chamber 106 is configured to enable deposition on surfaces of the substrate not covered by the SAM materials. For example, ALD materials generally do not form on surfaces which have a water contact angle greater than about 105°, such as greater than about 110°. Accordingly, the ALD process may be selectively deposited on a desired material of the substrate by utilizing the SAM material to improve the selectivity of deposition.

In one embodiment, the process chamber 108 is a post-process chamber, such as an anneal or bake chamber. In another embodiment, the process chamber 108 is a plasma processing chamber. In one example, the process chamber 108 enables SAM material removal from the substrate by thermal desorption or exposure to a plasma, such as an oxygen and/or hydrogen containing plasma. Alternatively or in combination, the process chamber 108 may be utilized for ALD clean up processes. For example, for an imperfect SAM treatment, some ALD nucleation may occur on defect sites of the substrate which are not covered by SAM materials. The process chamber 108 may be utilized to perform an etch process to etch exposed ALD materials which results in removal of the ALD films grown on the defect sites while only removing a small amount of material from the intended ALD growth location.

The transfer chamber 110, which enables transfer of the substrate between the process chambers 102, 104, 106, 108, houses a transfer robot 114 therein. The transfer robot 114 may be a single blade robot or a dual blade robot as illustrated. The dual blade robot 114 has a pair of substrate transport blades 116A, 116B attached to distal ends of a pair of extendable arms. The blades 116A, 116B are used to support and carry individual substrates between the chambers 102, 104, 106, 108. The transfer chamber 110 is also maintained under vacuum or an otherwise reduced oxygen environment. Air exposure of the substrate between SAM treatment and ALD treatment is potentially detrimental to the effectiveness of the SAM material for ALD blocking and transferring the substrate between the process chamber 104 and the process chamber 106 in-situ provides for improved processing performance, such as higher deposition selectivity. In addition, it may be desirable to perform cyclic SAM and ALD processes, thus, the transfer chamber enables efficient transfer of substrates between the process chambers 104, 106 while also improving the processing performance by preventing exposure of the substrate to an ambient air environment.

Figure 2:
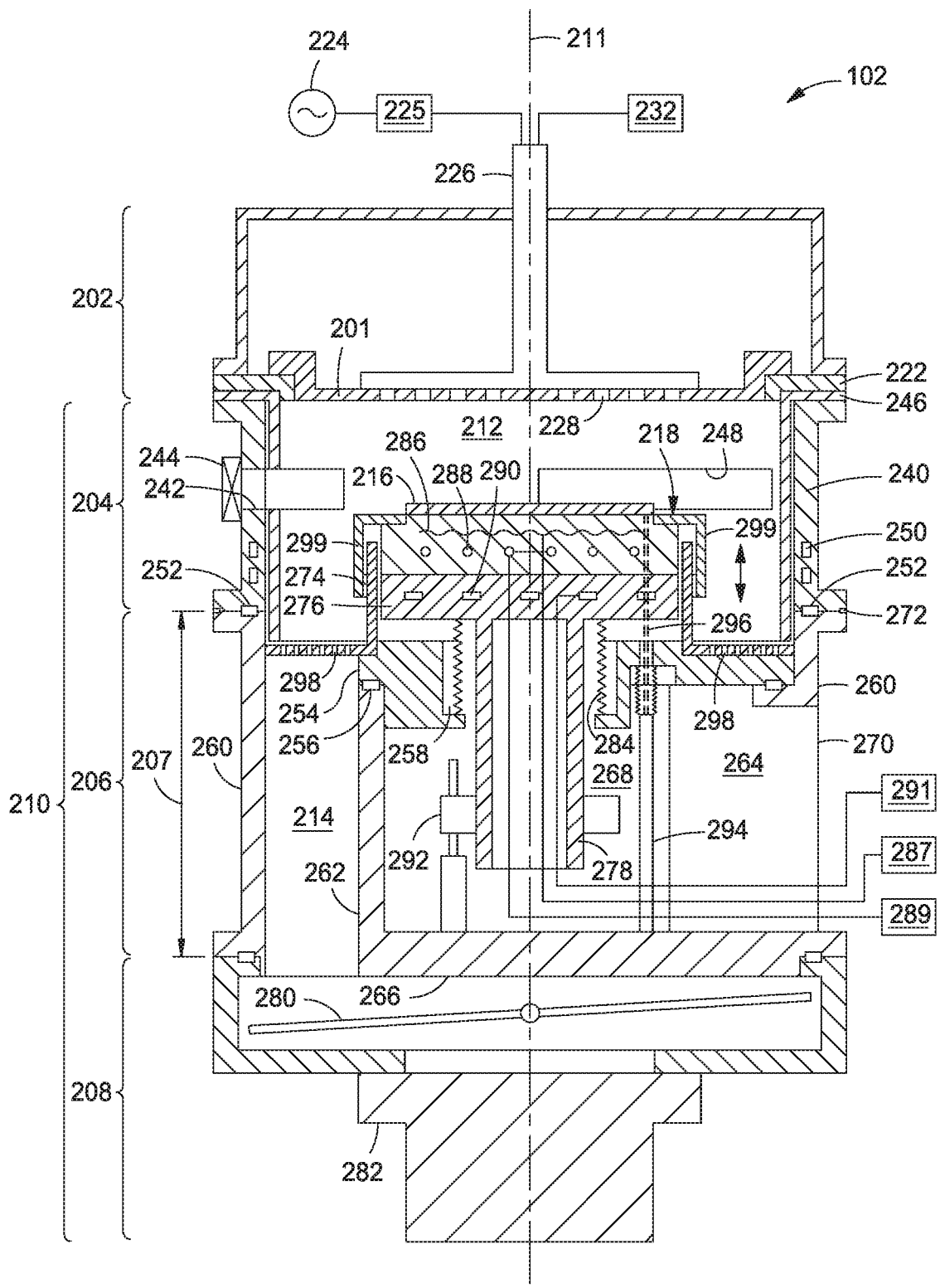
FIG. 2 illustrates a schematic, cross-sectional view of a process chamber according to one embodiment described herein.

FIG. 2 illustrates a schematic, cross-sectional view of the process chamber 102 according to one embodiment described herein. The process chamber 102 may be a plasma etch chamber, a plasma treatment chamber, a bake chamber, an anneal chamber, or other suitable vacuum processing chamber.

The process chamber 102 may be assembled from multiple modules. The modular design enables the process chamber 102 to meet various process requirements. As shown in FIG. 2, the process chamber 102 includes a source module 202, a process module 204, a flow module 206, and an exhaust module 208. The source module 202, the process module 204 and the flow module 206 collectively enclose a process region 212. The process module 204, the flow module 206, and the exhaust module 208 may be considered collectively as a chamber module 210 in certain embodiments.

During operation, a substrate 216 may be positioned on a substrate support assembly 218 and exposed to a process environment, such as plasma generated in the process region 212. Exemplary processes which may be performed in the process chamber 102 include etching, plasma treatment processes, and baking or annealing processes. Vacuum may be maintained in the process region 212 by suction from the exhaust module 208 through evacuation channels 214 defined by the flow module 206.

The process region 212 and the evacuation channels 214 are substantially symmetrically about a central axis 211 to provide symmetrical electrical current, gas flow, and thermal flow to establish uniform process conditions.

In one embodiment, the source module 202 is a capacitively coupled plasma source configured to generate one or more plasmas, at least one of which may be considered a remote plasma and one of which may be considered a direct plasma. The source module 202 may include a plate stack 201, which may function as an electrode (i.e. anode), isolated from and supported by the process module 204 by an isolator 222. The plate stack 201 may include various showerheads, diffusers, and screen/blocker plates arranged in a stacked orientation. The plate stack 201 may be connected to a gas source 232 through a gas inlet tube 226. The plate stack 201 and the gas inlet tube 226 may be all fabricated from a radio frequency (RF) conductive material, such as aluminum or stainless steel. The plate stack 201 may be coupled to a RF power source 224 via the conductive gas inlet tube 226. An RF matching network 225 may also be coupled to the RF power source 224. The conductive gas inlet tube 226 may be coaxial with the central axis 211 of the process chamber 102 so that both RF power and processing gases are symmetrically provided.

Even though a capacitive plasma source is described above, the source module 202 may be any suitable gas/plasma source according to a process requirement. For example, the source module 202 may be an inductive coupled plasma source, a remote plasma source, or a microwave plasma source.

The process module 204 is coupled to the source module 202. The process module 204 may include a chamber body 240 enclosing the process region 212. The chamber body 240 may be fabricated from a conductive material resistive to processing environments, such as aluminum or stainless steel. The substrate support assembly 218 may be centrally disposed within the chamber body 240 and positioned to support the substrate 216 in the process region 212 symmetrically about the central axis 211.

A slit valve opening 242 is formed through the chamber body 240 to allow passages of the substrate 216. A slit valve 244 is disposed outside the chamber body 240 to selectively open and close the slit valve opening 242.

In one embodiment, an upper liner assembly 246 is disposed within an upper portion of the chamber body 240 shielding the chamber body 240 from the process environment. The upper liner assembly 246 includes an opening 248 corresponding to the slit valve opening 242 formed in the chamber body 240. In one embodiment, the upper liner assembly 246 includes two or more openings 248 formed symmetrically about the central axis 211 to compensate for the asymmetry of the chamber body 240 caused by the slit valve opening 242, thus creating symmetry in the process region 212 within the process chamber 102. For example, the upper liner assembly 246 is a cylindrical wall having three identical openings 248 formed 120 degrees apart from one another. The upper liner assembly 246 may be constructed from a conductive, process compatible material, such as aluminum, stainless steel, and/or yttria (e.g., yttria coated aluminum).

In one embodiment, cooling channels 250 are formed in the chamber body 240 to provide temperature control to the chamber body 240 and the upper liner assembly 246 to enhance the thermal symmetry within the process chamber 102 and symmetry of the plasma provided in the process region 212.

The flow module 206 is attached to the process module 204. The flow module 206 provides flow paths between the process region 212 defined in the process module 204 and the exhaust module 208. The flow module 206 also provides an interface between the substrate support assembly 218 and the atmospheric environment exterior to the process chamber 102.

The flow module 206 has a height 207. The height 207 is selected according to amount of vertical movement or degree of variable volume dictated by the process requirements. Accordingly, when building a process chamber for a particular process, a flow module with a suitable height may be selected to meet the process requirements. The flow module may be swapped for another flow module with a different height when configuring the process chamber for a different process.

The flow module 206 includes an outer wall 260, an inner wall 262, two or more pairs of radial walls 264 connecting between the inner wall 262 and the outer wall 260, and a bottom wall 266 attached to the inner wall 262 and the two or more pairs of radial walls 264. The outer wall 260 includes two or more through holes 270 formed between each pair of radial walls 264. A chassis 254 is sealably disposed over the inner wall 262 and the two or more pairs of radial walls 264. The through holes 270 connect an atmosphere volume 268 defined by the inner wall 262 with the exterior environment, thus accommodating utility connections, such as electrical connections, gas connections, and cooling fluid connections. The chassis 254 includes a central opening 258 for receiving the substrate support assembly 218.

The outer wall 260 of the flow module 206 is shaped to match the chamber body 240 of the process module 204. In one embodiment, the outer wall 260 includes a flange which corresponds to a flange on the chamber body 240. A plurality of bolts may be used to secure the flanges to couple the flow module 206 to the process module 204. In one embodiment, a seal 252 is disposed between the flange of the chamber body 240 and the flange of the outer wall 260 to form a vacuum seal therebetween. The seal 252 may be an o-ring or other type of seal. In one embodiment, a RF grounding gasket 272 is disposed between the flow module 206 and the process module 204 to provide a solid contact therebetween for a uniform and symmetric RF ground return path.

The inner wall 262, bottom wall 266, radial walls 264 and the chassis 254 divide the volume inside the outer wall 260 into the evacuation channels 214 and the atmosphere volume 268. The evacuation channels 214 connect with the process region 212 of the process module 204. A seal 256 is disposed in the grooves 254b, 264b to provide vacuum seal between the evacuation channels 214 and the atmosphere volume 268. The seal 256 may be an o-ring or other type of seal, such as an elastomeric seal.

The outer wall 260 and the inner wall 262 may be cylindrical walls concentrically arranged. When assembled, a central axis of the outer wall 260 and the inner wall 262 coincides with the central axis 211 of the process chamber 102. The two or more pairs of radial walls 264 are arranged between the inner wall 262 and the outer wall 260 to divide the space therebetween into the evacuation channels 214 and through holes 270. In one embodiment, the two or more pairs of radial walls 264 are arranged so that the evacuation channels 214 are symmetrical about the central axis 211. The flow module 206 includes three pairs of radial walls 264 disposed at 120 degrees apart from one another forming three evacuation channels 214 symmetrical to the central axis 211. The symmetrical arrangement of the evacuation channels 214 promotes symmetrical removal of gases from the process region 212, resulting in symmetrical flow of gases across the substrate 216. In addition, the symmetrical positioning of the evacuation channels 214 and radial walls 264 promotes symmetry in the thermal distribution and electrical conductance in the process chamber 102.

The exhaust module 208 includes a symmetric flow valve 280 and a vacuum pump 282 attached to the symmetric flow valve 280. The vacuum pump 282 may be a symmetric turbo molecular pump in certain embodiments. The symmetric flow valve 280 connects to the evacuation channels 214 to provide symmetric and uniform flow in the process chamber 102.

The substrate support assembly 218 is positioned along the central axis 211 to position the substrate 216 symmetrically about the central axis 211. The substrate support assembly 218 is supported by the chassis 254. The substrate support assembly 218 includes a support plate 274, a base plate 276 that are disposed in the process region 212, and a hollow shaft 278 disposed through the central opening 258 of the chassis 254. A bellows 284 connects between the base plate 276 and the chassis 254 and surrounds the hollow shaft 278. The bellows 284 allows the substrate support assembly 218 to move vertically along the central axis 211 and provides vacuum seal between the atmosphere volume 268 in the flow module 206 and the process region 212 in the process module 204.

The support plate 274 may be an electrostatic chuck (ESC) having a chucking electrode 286. The chucking electrode 286 may be a monopolar 4-zone ESC, a bipolar 4-zone ESC, or a high temperature ESC. It is contemplated that the bipolar ESC may not require exposure to plasma for RF grounding during de-chucking of the substrate 216. The 4-zone ESCs may utilize four concentric heating zones (i.e. a heating element 288) to modulate center to edge heating profiles of substrates disposed on the chucking electrode 286 during processing to provide for improved temperature uniformity. The high temperature ESC may be suitable for utilization with temperatures up to about 600° C. In one embodiment, temperatures generated by the chucking electrode 286 may be suitable for sublimation of byproducts of substrate layers etched to maintain high material selectivity.

The support plate 274 may also include the heating element 288 for heating the substrate 216 during processing. The base plate 276 includes cooling channels 290 formed therein. The chucking electrode 286 may be connected to a bias power source 287 through the hollow shaft 278, the atmosphere volume 268, and one of the through holes 270. The heating element 288 is connected to a heating power source 289 through the hollow shaft 278, the atmosphere volume 268, and one of the through holes 270. The cooling channels 290 are connected to a cooling fluid source 291 through the hollow shaft 278, the atmosphere volume 268, and one of the through holes 170. In one embodiment, the support plate 274 is configured to heat the substrate 216 to a temperature greater than the vaporization temperature of a SAM material disposed on the substrate 216.

In one embodiment, an actuator assembly 292 is coupled to the hollow shaft 278 to move the substrate support assembly 218 vertically. The actuator assembly 292 may enable the substrate support assembly 218 to move within the process region 212 and change a processing position of the substrate 216. For example, the actuator assembly 292 positions the substrate support assembly 218 a distance of between about 0.5 inches and about 6 inches from the plate stack 201. The reduced distance between the plate stack 201 and the substrate support assembly 218, when compared to conventional plasma processing apparatus, provides an increased capacitively coupled plasma (CCP) generation window in a low pressure regime, such as less than 20 mTorr, for example about 1 mTorr. Accordingly, a gap between the RF electrode (i.e. the plate stack 201) and RF ground may be increased to enable low pressure CCP discharge by reducing the breakdown voltage of the CCP. In embodiments generating a CCP, the substrate support assembly 218 may also function as an electrode (i.e. cathode) or ground via the grounding gasket 272, depending upon the desired implementation. The actuator assembly 292 is disposed in the atmosphere volume 268. Lift pin actuators 294 are disposed in the atmosphere volume 268 to move lift pins 296.

A plasma screen 298 is disposed between the process region 212 and the evacuation channels 214 to confine the plasma within the process region 212. A substrate support liner 299 is disposed around the substrate support assembly 218 to shield the substrate support assembly 218 from the process chemistry.

During operation, one or more processing gases from the gas source 232 may enter the process region 212 through the plate stack 201. Suitable process gases for utilization in a low pressure regime include $H_2$, He, Ar, $O_2$, $NF_3$, $NH_3$, $N_2$, $N_2O$, $H_2O$, $SiF_4$, $SiH_4$, $SiCl_4$, and various fluorocarbon precursors. An RF power may be applied between the plate stack 201 and the substrate support assembly 218 to ignite and maintain a direct plasma (ion generation) in the process region 212. The RF power may also be applied to the plate stack 201 via the gas inlet tube 226 and a remote plasma (radical generation) may be generated within the plate stack 201. Synchronized or step RF pulsing may be utilized to control the ion energy and radical density. A zero DC bias may be utilized and may provide for reduced ion bombardment which may enable reduced particle generation. Multiple RF frequencies (i.e. 400 kHz, 2 MHz, 13.56 MHz, 27 MHz, 40 MHz, 60 MHz) may be utilized to modulate plasma density and ion energy. Tailored waveform and phase angle modulation may be utilized to control ion energy distribution. It is contemplated that the RF power source 224 and RF matching network 225 may be configured to operation at powers as low as about 5 W while maintaining stable plasma discharge.

The substrate 216 disposed on the substrate support assembly 218 may be processed by both the direct plasma and the remote plasma. For example, the direct plasma generated in the process region 212 is utilized to modify materials on the surface of the substrate 216 by exposing the material to ions. Radicals generated from the remote plasma in the plate stack 201 are extracted from the remote plasma to remove the modified materials with high selectivity to a non-modified material on the substrate 216. Accordingly, a highly selective material removal process may be achieved.

The one or more processing gases utilized to form the plasmas may be continuously supplied to the process region 212 or the plate stack 201 and the vacuum pump 282 operates through the symmetric flow valve 280 and the flow module 206 to generate a symmetric and uniform plasma profile adjacent the substrate 216. By defining the process region 212 and the evacuation channels 214 in separate modules, embodiments of the present disclosure provide uniform and symmetric process environment with simplified chamber structure, thus, reducing fabrication costs and enabling damage free plasma etching processes with high degrees of material selectivity.

Figure 3:
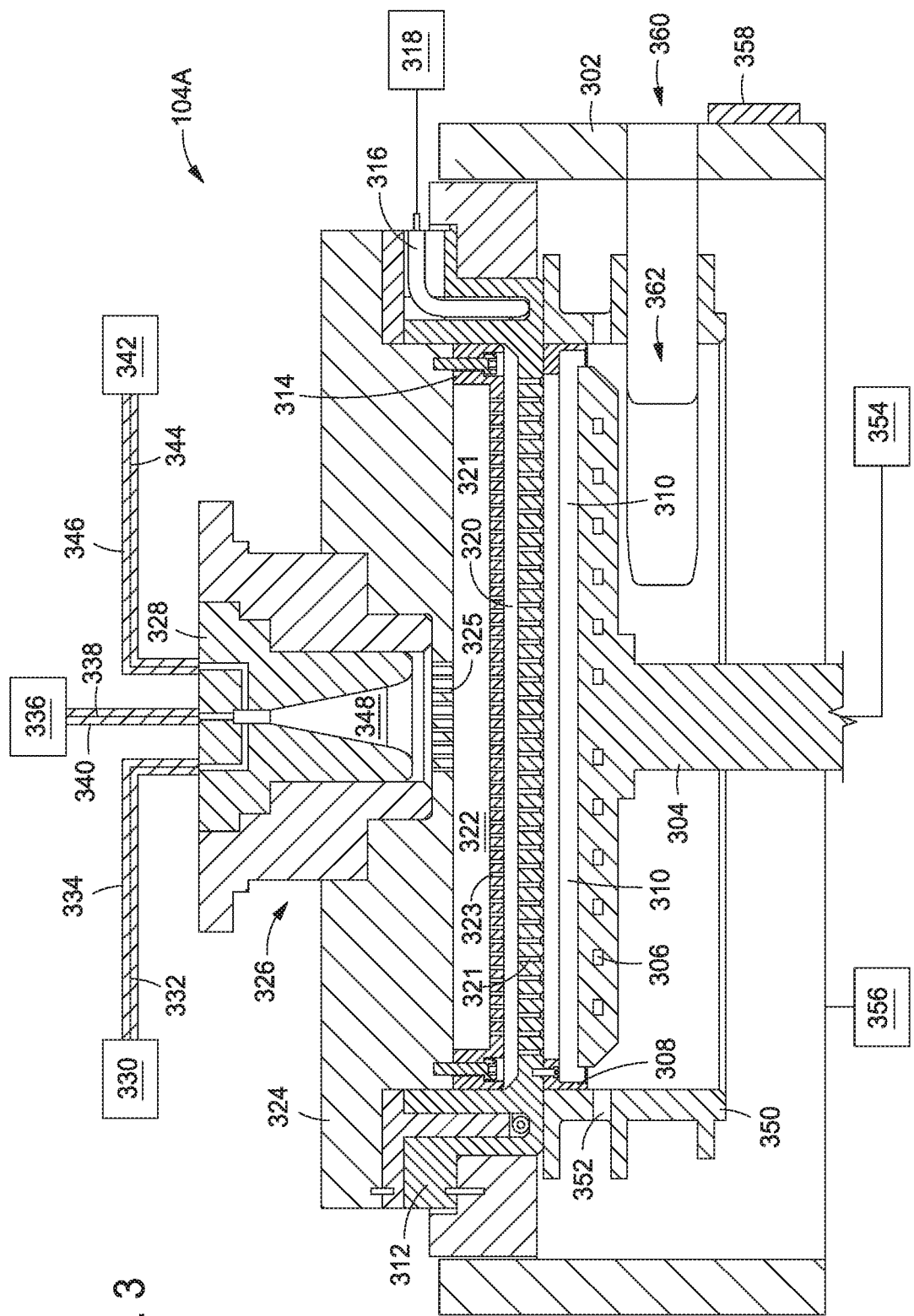
FIG. 3 illustrates a schematic, cross-sectional view of a process chamber according to one embodiment described herein.

FIG. 3 illustrates a schematic, cross-sectional view of the process chamber 104 according to one embodiment described herein. Embodiments of FIG. 3 illustrate one implementation of a process chamber 104A. The process chamber 104A includes a chamber body 302 which defines a process volume 310. A substrate support 304 is disposed in the process volume 310 and a showerhead 312 is disposed opposite the substrate support 304. A pumping liner 350 is coupled to the chamber body 302 and is disposed radially outward of the substrate support 304. A lid plate 324 is coupled to the showerhead 312 and supported by the chamber body 302. A backing plate 314 is disposed between the showerhead 312 and the lid plate 324. An injection assembly 326 is coupled to the lid plate 324 and the injection assembly may be in fluid communication with the process volume 310.

The chamber body 302 may be manufactured from a material suitable to withstand temperatures of up to about 300° C. For example, the chamber body 302 may be formed from aluminum, alloys thereof, stainless steel, and other suitable metallic materials. A slit valve opening 360 is formed in the chamber body 302 to allow for ingress and egress of a substrate to and from the process volume 310. A slit valve door 358 is coupled to the chamber body 302 and may be moveable to seal and unseal the slit valve opening 360. In one embodiment, the slit valve door 358 is formed from the same materials as the chamber body 302. Alternatively, the slit valve door 358 may be formed from materials different form the chamber body 302.

The substrate support 304 may be moveably disposed within the process volume 310. As illustrated, the substrate support 304 is disposed in an elevated processing position. The substrate support 304 may be lowered such that a substrate supporting surface of the substrate support 304 is coplanar with or below the slit valve opening 360 to allow for positioning of a substrate on the substrate support 304. The substrate support may be formed from a material suitable for operation at elevated processing temperatures and may be a metallic material, a ceramic material, or combinations thereof. For example, the pedestal may be formed from aluminum, aluminum alloys, stainless steel, or ceramic materials, such as aluminum oxide or aluminum nitride.

The substrate support 304 has a heating member 306 disposed therein and the heating member 306 is coupled to a power source 354. The power source 354 may also provide power for raising and lowering the substrate support 304 within the process volume 310. The heating member 306 is a resistive heater or the like and may be disposed within the substrate support 304 in any desirable orientation. For example, the heating member 306 is formed in the substrate support 304 in a spiral orientation or other suitable orientation configured to heat the substrate support uniformly, such as a tortured path orientation. In one embodiment, the heating member 306 is configured to heat the substrate support 304 to a temperature between about 100° C. and about 300° C.

The pumping liner 350 is sized to surround the substrate support 304 and the process volume 310. Similar to the substrate support 304, the pumping liner 350 may be formed from metallic materials, ceramic materials, or combinations thereof. For example, the pedestal may be formed from aluminum, aluminum alloys, stainless steel, or ceramic materials, such as aluminum oxide or aluminum nitride. The pumping liner 350 has an opening 362 formed therein to allow for ingress and egress of a substrate into the process volume 310. The opening 362 is positioned substantially co-planar with the slit valve opening 360. A plurality of holes 352 are formed along an inner diameter of the pumping liner 350. The plurality of holes 352 provide for evacuation of gases and other materials from the process volume 310 to an exhaust 356. Accordingly, the process volume 310 is in fluid communication with the exhaust 356 via the holes 352 of the pumping liner 350.

The showerhead 312, which is disposed opposite the substrate support 304, is coupled directly or indirectly to and supported by the chamber body 302. The showerhead 312 may be formed from materials similar to the materials utilized for the substrate support 304 and the pumping liner 350. The showerhead 312 has a plurality of first passages 321 formed therein which extend from the process volume 310 to a first plenum 320 formed between the showerhead 312 and the backing plate 314. The first passages 321 enable fluid communication and the transfer of vapor from the first plenum 320 to the process volume 310.

A showerhead liner 308 is also disposed in the process volume 310. The showerhead liner 308 may be formed from the same or similar materials as the showerhead 312 and the showerhead liner may be coupled to the showerhead 312. In one embodiment, the showerhead liner 308 is a ring-like body. The showerhead liner 308 has an inner diameter which is substantially similar to an outer diameter of the substrate support 304. The inner diameter of the showerhead liner 308 may also be sized such that the innermost surface of the showerhead liner 308 is radially outward of the first passages 321 in order to not interfere with vapor delivery to the process volume 310. The showerhead liner 308 occupies physical space within the process volume 310 and reduces the volume of the process volume 310, thereby reducing the amount of SAM precursor needed to form SAM molecules on a substrate. Thus, efficiency of a SAM formation process may be increased.

The showerhead 312 also has a heater 316 disposed therein. The heater 316 is a resistive heater of the like and may be disposed within the showerhead 312 radially outward of the first passages 321. In one embodiment, the heater 316 is disposed within the showerhead 312 in a circumferential orientation which substantially surrounds the first passages 321. The heater 316 may be coupled to a power source 318 to enable resistive heating of the showerhead 312. In one embodiment, the showerhead 312 is configured to be heated to a temperature between about 150° C. and about 250° C.

The backing plate 314, which is disposed between the showerhead and the lid plate 324, and partially defines the first plenum 320, has a second plurality of passages 323 disposed therein. A second plenum 322 is formed between the backing plate 314 and the lid plate 324. The passages 323 enable the second plenum 322 to be in fluid communication with the first plenum 320. A third plurality of passages 325 is formed in the lid plate 324 between the second plenum 322 and the injection assembly 326.

The injection assembly 326 is configured to deliver vaporized materials to the process volume 310. In operation, vaporized materials, such as SAM precursors and/or co-reactant precursors, are delivered from the injection assembly 326 through the third plurality of passages 325 to the second plenum 322. The vaporized materials travel through the second plurality of passages 323 of the backing plate 314 to the first plenum 320 and through the first plurality of passages 321 of the showerhead 312 to the process volume 310. After processing of a substrate, the vaporized materials and other effluent are removed from the process volume 310 through the holes 352 of the pumping liner 350 via the exhaust 356.

The injection assembly 326 includes a housing 327 coupled to the lid plate 324 and an injector 328 coupled to the housing 327. The injector 328 is disposed within the housing 327 and the injector 328 includes a third plenum 348. In one embodiment, the third plenum 348 is funnel shaped. The shape of the third plenum 348 may be configured to facilitate and encourage mixing of vaporized materials prior to delivery to the process volume 310. Although the third plenum 348 is illustrated as a funnel shape, other shapes which facilitate mixing of vaporized materials are contemplated.

A first ampoule 330 is coupled to the injection assembly 326 via a first conduit 332. More specifically, the first ampoule 330 is in fluid communication with the third plenum 348 of the injector 328 via the first conduit 332. The first conduit 332 extends from the first ampoule 330 to the third plenum 348. A first heater jacket 334 surrounds the first conduit 332 on portions of the first conduit 332 disposed beyond the injector 328. In one embodiment, the first heater jacket 334 is resistively heated to maintain a temperature of the first conduit 332 between about 50° C. and about 250° C.

The first ampoule 330 is configured to vaporize and deliver SAM precursors to the process volume 310. Suitable examples of SAM precursors include phosphonic acid materials, such as butylphosphonic acid, hexylphosphonic acid, octylphosphonic acid, dodecylphosphonic acid, and octadecylphosphonic acid. In another embodiment, the SAM precursors may be thiol materials, such as dodecanethiol and octadecanethiol. In another embodiment, the SAM precursors may be silylamine materials, such as tris(dimethylamino)octylsilane and tris(dimethylamino)octadecylsilane. In another embodiment, the SAM precursors may be chlorosilane materials, such as dodecyltrichlorosilane and octadecyltrichlorosilane. In another embodiment, the SAM precursors may be oxysilane materials, such as octadecylthiethoxysilane and octadecyltrimethylsilane. In another embodiment, the SAM precursors may have a fluorinated R group, such as (1,1,2,2-perfluorodecyl)trichlorosilane, trichloro(1,1,2,2-perflrorooctyl)silane, (trideca-fluoro-1,1,2,2-tetrahydrooctyl)trichlorosilane, (tridecafluoro-1,1,2,2-tetrahydro-octyl)triethoxysilane, (tridecafluoro-1,1,2,2-tetrahydrooctyl)methyldichlorosilane, (tridecafluoro-1,1,2,2-tetrahydrooctyl)dimethylchlorosilane, and (heptadecafluoro-1,1,2,2-tetrahydrodecyl)trichlorosilane, among others.

A second ampoule 336 is coupled to the injection assembly 326 via a second conduit 338. More specifically, the second ampoule 336 is in fluid communication with the third plenum 348 of the injector 328 via the second conduit 338. The second conduit 338 extends from the second ampoule 336 to the third plenum 348. A second heater jacket 340 surrounds the second conduit 338 on portions of the second conduit 338 disposed beyond the injector 328. In one embodiment, the second heater jacket 340 is resistively heated to maintain a temperature of the second conduit 338 between about 50° C. and about 250° C.

The second ampoule 336 is configured to vaporize and deliver co-reactant precursors to the process volume 310. Suitable examples of co-reactant precursors include hydroxyl moiety materials, such as ambient air, water solution or vapor, hydrogen peroxide solution or vapor, organic alcohol solutions or vapors, such as methanol, isopropanol, ethanol, and diols, among others. Hydrogen gas and oxygen gas may also be utilized in combination to form hydroxyl moieties. It is contemplated that other non-hydroxyl moiety precursors may also be utilized in accordance with the embodiments described herein. Non-hydroxyl moiety precursors may include nitrogen gas, (di)isocyanates, hydrogen sulfide, and ammonia, among others.

In one embodiment, a cleaning gas source 342 is coupled to the injection assembly 326 via a third conduit 344. More specifically, the cleaning gas source 342 is in fluid communication with the third plenum 348 of the injector 328 via the third conduit 344. The third conduit 344 extends from the cleaning gas source 342 to the third plenum 348. A third heater jacket 346 may optionally surround the third conduit 344 on portions of the third conduit 344 disposed beyond the injector 328. In one embodiment, the third heater jacket 346 is resistively heated to maintain a temperature of the third conduit 344 between about 50° C. and about 250° C. Gases provided by the cleaning gas source 342 may include chlorine containing materials, fluorine containing materials, and other materials suitable for cleaning components of the process chamber 104A.

In another embodiment, the cleaning gas source 342 is a remote plasma source. In this embodiment, the remote plasma source may energize cleaning gas to generate radicals and/or ions and the deliver the plasma products to the process volume 310. In one embodiment, the remote plasma source is optional.

In another embodiment, the cleaning gas source 342 is a carrier gas source. A carrier gas may be utilized to facilitate delivery of vapor phase SAM precursors and the carrier gas, depending on the process volume 310, may be delivered at a flow rate suitable to facilitate transport of the SAM precursors from the third plenum 348, through the third passages 325, through the second plenum 322 and the second passages 323, and through the first plenum 320 and the first passages 321 to the process volume 310. Suitable carrier gases include gases, such as noble gases or the like, that are generally inert under SAM adsorption conditions that facilitate delivery of the SAM molecules to surfaces of the substrate.

The heated showerhead 312 and the heated substrate support 304 may heat the process volume 310 to a temperature of between about 50° and about 250° C. The ampoules 330, 336 and conduits 332, 338 may be heated to similar temperatures. The showerhead liner 308, backing plate 314, lid plate 324, and injection assembly 326 may also be conductively heated by the showerhead 312. The temperature of the flow path along which the SAM precursors travel is maintained at an elevated temperature to prevent condensation of the vaporized SAM precursors on the various apparatus. The process volume 310 may also be maintained at a pressure of less than about 600 Torr which may also facilitate maintenance of the vapor state of the SAM precursor and co-reactant precursor.

In an operational embodiment, the SAM precursor is continually flowed through the process volume 310 from the first ampoule 330 to the exhaust 356. In this embodiment, the pressure of the process volume 310 is maintained in an isobaric state. In another embodiment, the SAM precursor fills the process volume 110 and be maintained in the process volume 110 for a period of time prior to being exhausted from the process volume 310. In another embodiment, co-reactant precursors are continually flowed to the process volume 310 or provided in a discontinuous manner, such as pulsing. In another embodiment, the SAM precursor and the co-reactant precursor are provided to the process volume 310 in an alternating manner, either continually or statically.

Figure 4:
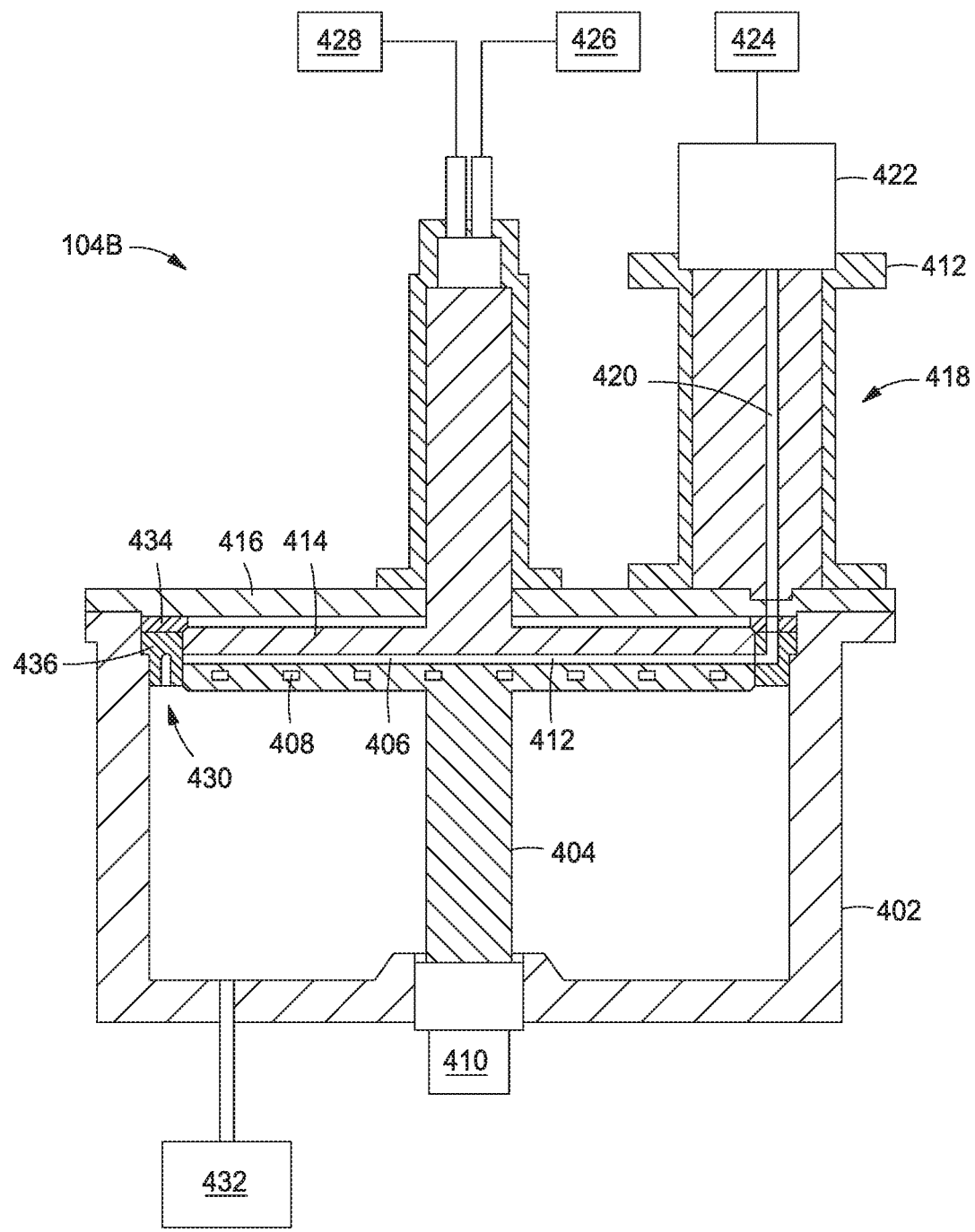
FIG. 4 illustrates a schematic, cross-sectional view of a process chamber according to one embodiment described herein.

FIG. 4 illustrates a schematic, cross-sectional view of the process chamber 104 according to another embodiment described herein. Embodiments of FIG. 4 illustrate one implementation of a process chamber 104B. The process chamber 104B includes a chamber body 402 which defines a process volume 406. A substrate support 404 is disposed within the process volume 406 and a heater 414 is disposed in the process volume 406 opposite the substrate support 404. A lid plate 416 is coupled to the chamber body 402 and a vapor generation assembly 418 is coupled to the lid plate 416.

The chamber body 402 is formed from the same or similar materials as the chamber body 302. Similarly, the substrate support 404 may be formed from the same or similar materials as the substrate support 304. The substrate support 404 includes a heating member 408 disposed therein. The heating member 408 is coupled to a power source 410 and be configured to heat the substrate support 404 to temperatures between about 100° C. and about 500° C.

The heater 414, which is disposed opposite the substrate support 404, may further define the process volume 406 between the heater 414 and the substrate support 404. The heater 414 is coupled to a power source 428 and is configured to heat the heater 414 to temperatures between about 100° C. and about 500° C. A temperature of the process volume 406 may be maintained during processing at a temperature of between about 50° C. and about 500° C., such as between about 100° C. and about 250° C. A gas source 426 is also coupled to the heater 414 and the gas source 426 is in fluid communication with the process volume 406. In one embodiment, the gas source 426 is configured to deliver a co-reactant precursor to the process volume 406. Alternatively, the gas source 426 is configured to deliver a purge gas, a carrier gas, or a cleaning gas to the process volume 406, depending on the desired implementation.

The vapor generation assembly 418, such as a vaporizer, a direct liquid injection vaporizer or the like, is coupled to the lid plate 416. The vapor generation assembly 418 is coupled to the lid plate 416 radially outward of the process volume 406. The position of the vapor generation assembly 418, and injection location of vapor to the process volume 406, provides for a cross-flow type exposure of a substrate to SAM precursors. The vapor generation assembly 418 includes a vaporizer 422 and an injector 420 extending from the vaporizer 422. The vaporizer 422 is coupled to a SAM precursor source 524 and receives SAM precursors in liquid form for vaporization. The vaporizer 422 is maintained at a temperature of between about 100° C. and about 500° C. to vaporize the SAM precursor and the temperature of the vaporizer 422 is determine, at least in part, by the vapor pressure of the SAM precursor.

Vaporized SAM precursor exits the vaporizer 422 and travels through the injector 420. The injector 420 extends from the vaporizer 422 through the vapor generation assembly 418, which is maintained at an elevated temperature by a heater jacket 412 to maintain the SAM precursor in a vapor state, and to the lid plate 416.

A manifold 436 is coupled to the chamber body 402 radially outward of the substrate support 404 and the heater 414. The manifold 436 is formed from the same of similar materials as the substrate support 404 and the heater 414. The manifold 436 is sized to circumscribe the process volume 406 such that an inner diameter of the manifold 436 is larger than an outer diameter of the substrate support 404 and an outer diameter of the heater 414. Vapor may flow through the manifold 436 from the injector 420 to an outlet 430 disposed opposite the injector 420. An exhaust 432 is also coupled to and in fluid communication with the process volume 406. More specifically, the exhaust 432 is in fluid communication with the process volume 406 via the outlet 430. Accordingly, process volume effluent may be evacuated from the process volume 406 through the outlet 430 to the exhaust 432.

A thermal insulator 434 is coupled to the lid plate 416 radially outward of the heater 414. The thermal insulator 434 is sized similarly to the manifold 436 and may be disposed between the manifold 436 and the lid plate 416. The thermal insulator 434 may also be coupled to or in contact with the chamber body 402. The thermal insulator 434 is formed from a thermally insulative material, such as a ceramic material or the like, configured to reduce or prevent the conduction of heat from the substrate support 404, the heater 414, and the manifold 436 from to the lid plate 416. In one embodiment, the thermal insulator 434 is optional. In this embodiment, an air gap functions as a thermal break between the lid plate 416 and the substrate support 404, the heater 414, and the manifold 436.

Figure 5:
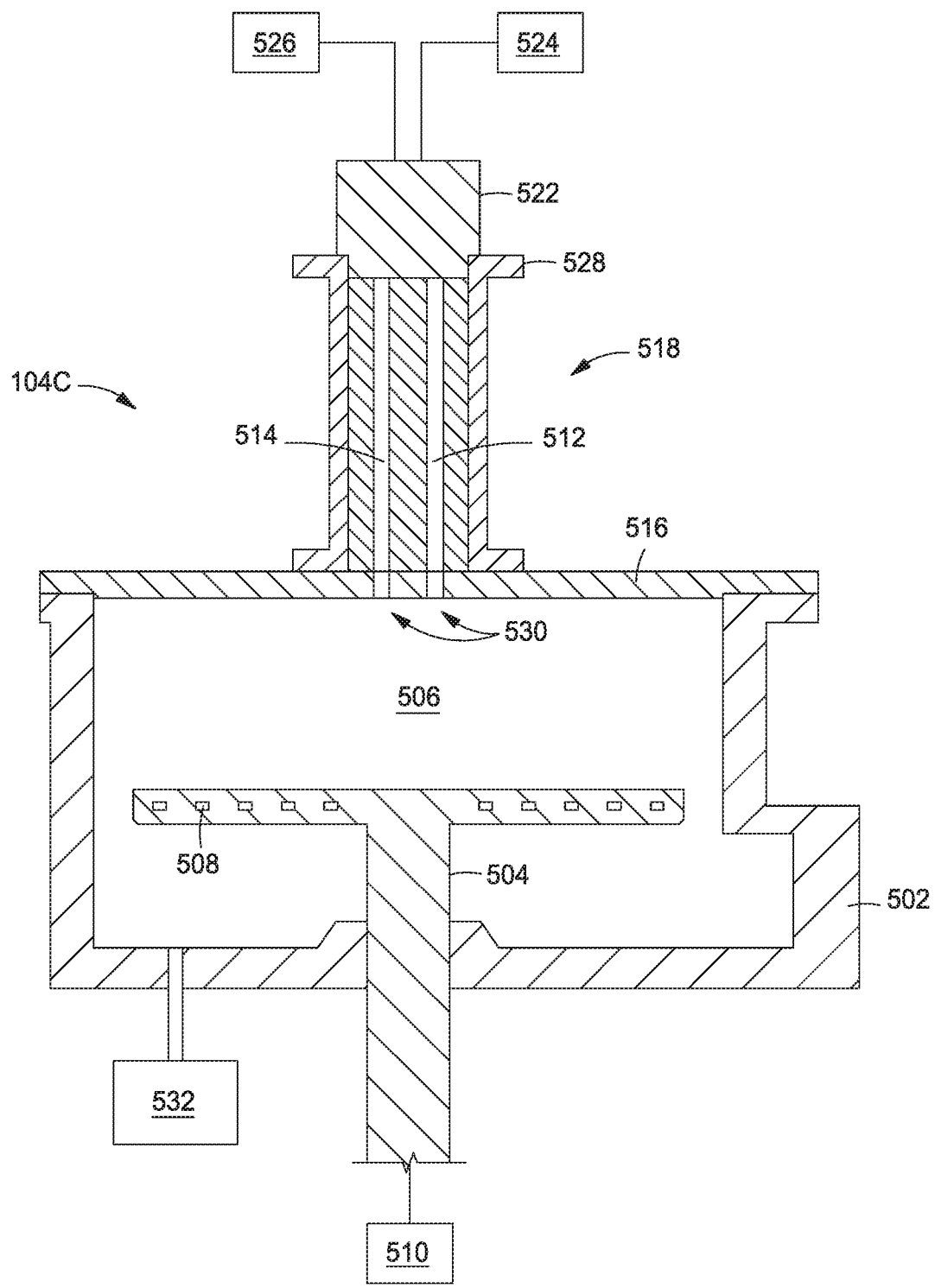
FIG. 5 illustrates a schematic, cross-sectional view of a process chamber according to one embodiment described herein.

FIG. 5 illustrates a schematic, cross-sectional view of the process chamber 104 according to one embodiment described herein. Embodiments of FIG. 5 illustrate one implementation of a process chamber 104C. The process chamber 104C includes a chamber body 502 which defines a process volume 506. A substrate support 504 is disposed within the process volume 506 and a lid plate 516 is coupled to the chamber body 502 opposite the substrate support 504. A vapor generation assembly 518 is coupled to the lid plate 516.

The chamber body 502 is formed from the same or similar materials as the chamber body 402. Similarly, the substrate support 504 is formed from the same or similar materials as the substrate support 404. The substrate support 504 includes a heating member 508 disposed therein. The heating member 508 is coupled to a power source 510 and is configured to heat the substrate support 504 to temperatures between about 100° C. and about 500° C.

The vapor generation assembly 518, such as a vaporizer, a direct liquid injection vaporizer or the like, is coupled to the lid plate 516 adjacent a center of the process volume 506. The position of the vapor generation assembly 518, and injection location of vapor to the process volume 506, provides for a top-down type exposure of a substrate to SAM precursors. The vapor generation assembly 518 includes a vaporizer 522 and one or more injectors 512, 514 extending from the vaporizer 522. The vaporizer 522 is coupled to a SAM precursor source 524 and receives SAM precursors in liquid form for vaporization. The vaporizer 522 is maintained at a temperature of between about 100° C. and about 500° C. to vaporize the SAM precursor and the temperature of the vaporizer 522 may be determined, at least in part, by the vapor pressure of the SAM precursor.

Vaporized SAM precursors exit the vaporizer 522 and travel through one or both of the injectors 512, 514. The injectors 512, 514 extend from the vaporizer 522 through the vapor generation assembly 518, which is maintained at an elevated temperature by a heater jacket 528 to maintain the SAM precursor in a vapor state, and to the lid plate 516. In one embodiment, SAM precursor from the source 524 is introduced to the process volume via the injector 512 through an outlet 530. A gas source 526 is also in fluid communication with the process volume 506. The gas source 526 introduces a liquid or gas to the vapor generation assembly 518 and the generated vapor is introduced to the process volume 506 via the injector 514 and the outlet 530. In one embodiment, the gas source 526 provides a co-reactant precursor. In another embodiment, the gas source 526 provides a purge gas, a carrier gas, or a cleaning gas, depending upon the desired implementation.

The process volume 506 is also in fluid communication with an exhaust 532. Accordingly, process volume effluent may be evacuated from the process volume 506 via the exhaust 532. Both process chambers 104B and 104C may be maintained at a pressure of less than about 600 Torr. Processes performed in the process chambers 104B, 104C may be isobaric or non-isobaric. Similarly, the processes performed in the process chambers 104B, 104C may be isothermal or non-isothermal.

Figure 6:
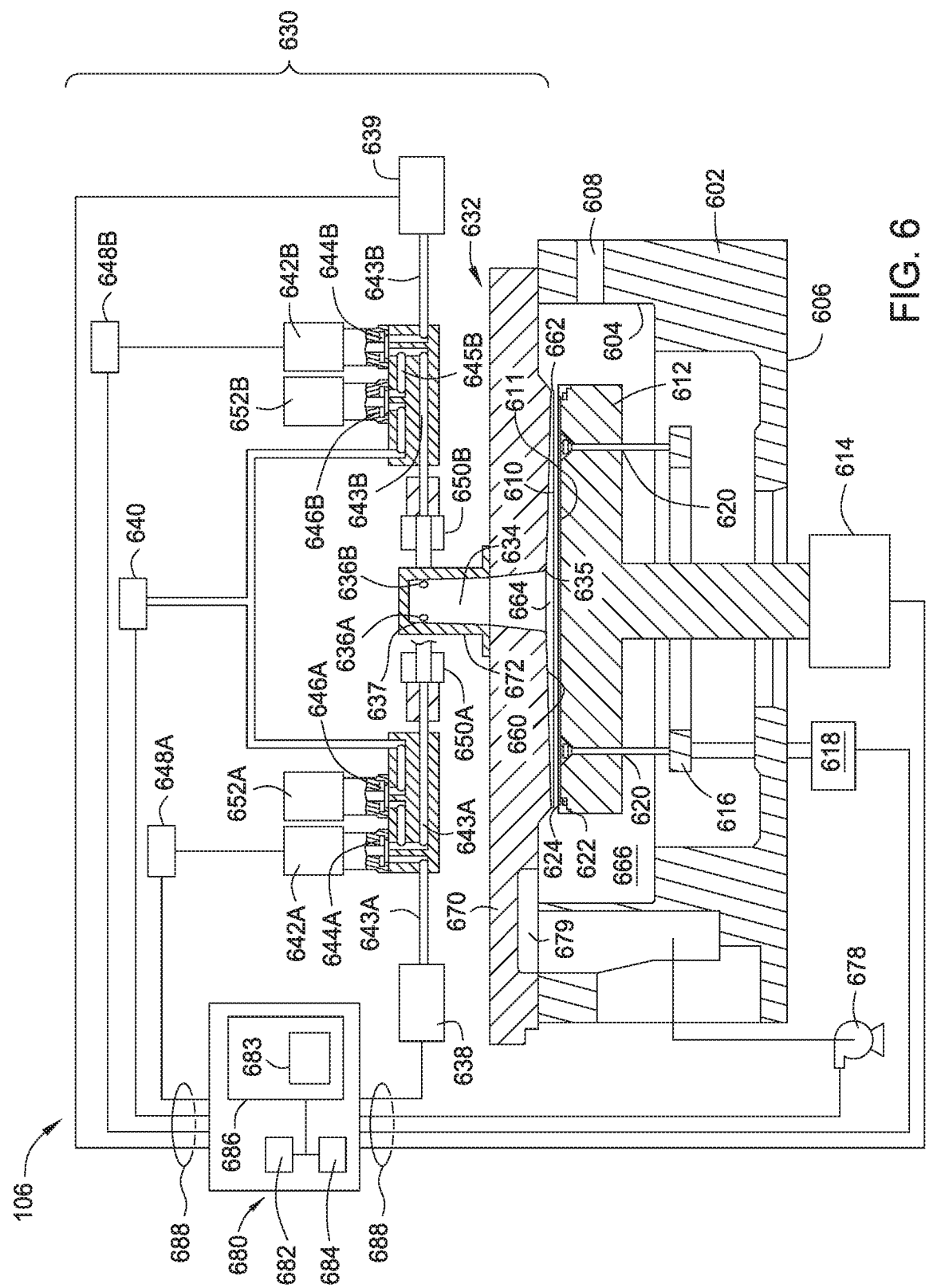
FIG. 6 illustrates a schematic, cross-sectional view of a process chamber according to one embodiment described herein.

FIG. 6 illustrates a schematic, cross-sectional view of the process chamber 106 according to one embodiment described herein. The process chamber 106 includes a gas delivery system 630 adapted for ALD or sequential layer deposition. The process chamber 106 contains a chamber body 602 having sidewalls 604 and a bottom 606. A slit valve 608 in provides ingress and egress of a substrate 610, to and from the process chamber 106.

A substrate support 612 supports the substrate 610 on a substrate receiving surface 611. The substrate support 612 is mounted to a lift motor 614 to raise and lower the substrate support 612 and the substrate 610 disposed thereon. A lift plate 616 connected to a lift motor 618 is mounted in the process chamber 106 and raises and lowers lift pins 620 movably disposed through substrate support 612. The lift pins 620 raise and lower the substrate 610 over the surface of substrate support 612. The substrate support 612 may include a vacuum chuck (not shown), an electrostatic chuck (not shown), or a clamp ring (not shown) for securing the substrate 610 to the substrate support 612 during processing.

The substrate support 612 may be heated to heat the substrate 610 disposed thereon. For example, the substrate support 612 may be heated using an embedded heating element, such as a resistive heater (not shown), or may be heated using radiant heat, such as heating lamps (not shown) disposed above the substrate support 612. A purge ring 622 may be disposed on the substrate support 612 to define a purge channel 624 which provides a purge gas to a peripheral portion of the substrate 610 to prevent deposition thereon.

A gas delivery system 630 is disposed at an upper portion of the chamber body 602 to provide a gas, such as a process gas and/or a purge gas, to the process chamber 106. A vacuum system 678 is in communication with a pumping channel 679 to evacuate any desired gases from the process chamber 106 and to help maintain a desired pressure or a desired pressure range inside a pumping zone 666 of the process chamber 106.

In one embodiment, the gas delivery system 630 contains a chamber lid assembly 632. The chamber lid assembly 632 includes an expanding channel 634 extending from a central portion of chamber lid assembly 632 and a lower surface 660 extending from the expanding channel 634 to a peripheral portion of the chamber lid assembly 632. A lower surface 660 is sized and shaped to substantially cover the substrate 610 disposed on the substrate support 612. The expanding channel 634 has gas inlets 636a, 636b to provide gas flows from two similar pairs of valves 642a/652a, 642b/652b, which may be provided together and/or separately.

In one configuration, valve 642a and valve 642b are coupled to separate reactant gas sources but may also be coupled to the same purge gas source. For example, valve 642a is coupled to reactant gas source 638 and valve 642b is coupled to reactant gas source 639, and both valves 642a, 642b are coupled to purge gas source 640. Each valve 642a, 642b includes a delivery line 643a, 643b having a valve seat assembly 644a, 644b and each of valves 652a, 652b includes a purge line 645a, 645b having a valve seat assembly 646a, 646b. Delivery line 643a, 643b is in fluid communication with the reactant gas source 638, 639 and is in fluid communication with gas inlet 636a, 636b of the expanding channel 634. The valve seat assembly 644a, 644b of delivery line 643a, 643b controls the flow of the reactant gas from the reactant gas source 638, 639 to the expanding channel 634. Purge line 645*a*, 645*b* is in fluid communication with purge gas source 640 and intersects delivery line 643*a*, 643*b* downstream of valve seat assembly 644*a*, 644*b* of delivery line 643*a*, 643*b*. Valve seat assembly 646*a*, 646*b* of purge line 645*a*, 645*b* controls the flow of the purge gas from purge gas source 640 to the expanding channel 634. If a carrier gas is used to deliver reactant gases from the reactant gas source 638, 639, preferably the same gas is used as a carrier gas and a purge gas (i.e., an argon gas used as a carrier gas and a purge gas).

Each valve seat assembly 644*a*, 644*b*, 646*a*, 646*b* may contain a diaphragm (not shown) and a valve seat (not shown). The diaphragm may be biased open or closed and may be actuated closed or open respectively. The diaphragms may be pneumatically actuated or may be electrically actuated. Pneumatically actuated valves include pneumatically actuated valves available from Fujikin, Inc. and Veriflo Division, Parker Hannifin, Corp. Electrically actuated valves include electrically actuated valves available from Fujikin, Inc. For example, an ALD valve that may be used is the Fujikin Model No. FPR-UDDFAT-21-6.35-PI-ASN or the Fujikin Model No. FPR-NHDT-21-6.35-PA-AYT. Programmable logic controllers 648*a*, 648*b* may be coupled to valves 642*a*, 642*b* to control actuation of the diaphragms of the valve seat assemblies 644*a*, 644*b*, 646*a*, 646*b* of valves 642*a*, 642*b*. Pneumatically actuated valves may provide pulses of gases in time periods as low as about 0.020 seconds. Electrically actuated valves may provide pulses of gases in time periods as low as about 0.005 seconds. An electrically actuated valve typically requires the use of a driver coupled between the valve and the programmable logic controller.

Each valve 642*a*, 642*b* may be a zero dead volume valve to enable flushing of a reactant gas from delivery line 643*a*, 643*b* when valve seat assembly 644*a*, 644*b* is closed. For example, purge line 645*a*, 645*b* may be positioned adjacent valve seat assembly 644*a*, 644*b* of delivery line 643*a*, 643*b*. When valve seat assembly 644*a*, 644*b* is closed, purge line 645*a*, 645*b* may provide a purge gas to flush delivery line 643*a*, 643*b*. In the embodiment shown, purge line 645*a*, 645*b* is positioned slightly spaced from the valve seat assembly 644*a*, 644*b* of delivery line 643*a*, 643*b* so that a purge gas is not directly delivered into valve seat assembly 644*a*, 644*b* when open. A zero dead volume valve as used herein is defined as a valve which has negligible dead volume (i.e., not necessary zero dead volume).

Each valve pair 642*a*/652*a*, 642*b*/652*b* may be adapted to provide a combined gas flow and/or separate gas flows of the reactant gas and the purge gas. In reference to valve pair 642*a*/652*a*, one example of a combined gas flow of the reactant gas and the purge gas includes a continuous flow of a purge gas from purge gas source 640 through purge line 645*a* and pulses of a reactant gas from reactant gas source 638 through delivery line 643*a*. The continuous flow of the purge gas may be provided by leaving the diaphragm of valve seat assembly 646*a* of the purge line 645*a* open. The pulses of the reactant gas from reactant gas source 638 may be provided by opening and closing the diaphragm of valve seat assembly 644*a* of delivery line 643*a*. In reference to valve pair 642*a*/652*a*, one example of separate gas flows of the reactant gas and the purge gas includes pulses of a purge gas from purge gas source 640 through purge line 645*a* and pulses of a reactant gas from reactant gas source 638 through delivery line 643*a*. The pulses of the purge gas may be provided by opening and closing the diaphragm of valve seat assembly 646*a* of purge line 645*a*. The pulses of the reactant gas from reactant gas source 638 may be provided by opening and closing the diaphragm of valve seat assembly 644*a* of delivery line 643*a*.

Delivery lines 643*a*, 643*b* of valves 642*a*, 642*b* may be coupled to gas inlets 636*a*, 636*b* through gas conduits 650*a*, 650*b*. Gas conduits 650*i*, 650*b* may be integrated or may be separate from valves 642*a*, 642*b*. In one aspect, valves 642*a*, 642*b* are coupled in close proximity to expanding channel 634 to reduce any unnecessary volume of delivery line 643*a*, 643*b* and gas conduits 650*a*, 650*b* between valves 642*a*, 642*b* and gas inlets 636*a*, 636*b*.

The expanding channel 634 contains a channel which has an inner diameter which increases from an upper portion 637 to a lower portion 635 of expanding channel 634 adjacent lower surface 660 of chamber lid assembly 632. In one embodiment, expanding channel 234 may be shaped as a truncated cone (including shapes resembling a truncated cone). Whether a gas is provided toward the walls of expanding channel 634 or directly downward towards substrate 610, the velocity of the gas flow decreases as the gas flow travels through expanding channel 634 due to the expansion of the gas. The reduction of the velocity of the gas flow helps reduce the likelihood the gas flow will blow off reactants adsorbed on the surface of substrate 610.

Not wishing to be bound by theory, it is believed that the diameter of expanding channel 634, which is gradually increasing from upper portion 637 to lower portion 635 of expanding channel 634, allows less of an adiabatic expansion of a gas through expanding channel 634 which helps to control the temperature of the gas. For instance, a sudden adiabatic expansion of a gas delivered through gas inlet 636*a*, 636*b* into expanding channel 634 may result in a drop in the temperature of the gas which may cause condensation of the gas and formation of droplets. On the other hand, a gradually expanding channel 634 is believed to provide less of an adiabatic expansion of a gas. Therefore, more heat may be transferred to or from the gas, and, thus, the temperature of the gas may be more easily controlled by controlling the surrounding temperature of the gas (i.e., controlling the temperature of chamber lid assembly 632). The gradually expanding channel 634 may contain one or more tapered inner surfaces, such as a tapered straight surface, a concave surface, a convex surface, or combinations thereof or may contain sections of one or more tapered inner surfaces (i.e., a portion tapered and a portion non-tapered).

In one embodiment, gas inlets 636*a*, 636*b* are located adjacent upper portion 637 of expanding channel 634. In other embodiments, one or more gas inlets 636*a*, 636*b* may be located along the length of expanding channel 634 between upper portion 637 and lower portion 635.

At least a portion of lower surface 660 of chamber lid assembly 632 may be tapered from expanding channel 634 to a peripheral portion of chamber lid assembly 632 to help provide an improved velocity profile of a gas flow from expanding channel 634 across the surface of substrate 610 (i.e., from the center of the substrate to the edge of the substrate). Lower surface 660 may contain one or more tapered surfaces, such as a straight surface, a concave surface, a convex surface, or combinations thereof. In one embodiment, lower surface 660 is tapered in the shape of a funnel.

A choke 662 may be located at a peripheral portion of chamber lid assembly 632 adjacent the periphery of substrate 610. Choke 662, when chamber lid assembly 632 is assembled to form a processing zone around substrate 610, contains any member restricting the flow of gas therethrough at an area adjacent the periphery of substrate 610. In one embodiment, the spacing between choke 662 and substrate support 612 is between about 0.04 inches and about 2.0 inches, and preferably between 0.04 inches and about 0.2 inches. The spacing may vary depending on the gases being delivered and the process conditions during deposition. Choke 662 helps provide a more uniform pressure distribution within the volume or reaction zone 664 defined between chamber lid assembly 632 and substrate 610 by isolating reaction zone 664 from the non-uniform pressure distribution of pumping zone 666.

In one aspect, since reaction zone 664 is isolated from pumping zone 666, a reactant gas or purge gas needs only adequately fill reaction zone 664 to ensure sufficient exposure of substrate 610 to the reactant gas or purge gas. Process chamber 106 sequentially introduces reactants to the surface of substrate 610 to provide absorption of alternating thin layers of the reactants onto the surface of substrate 610. As a consequence, atomic layer deposition does not require a flow of a reactant which reaches the surface of substrate 610 simultaneously. Instead, a flow of a reactant needs to be provided in an amount which is sufficient to adsorb a thin layer of the reactant on the surface of substrate 610.

Chamber lid assembly 632 may include cooling elements and/or heating elements depending on the particular gas being delivered therethrough. Controlling the temperature of chamber lid assembly 632 may be used to prevent gas decomposition, deposition, or condensation on chamber lid assembly 632. For example, water channels (not shown) may be formed in chamber lid assembly 632 to cool chamber lid assembly 632. In another example, heating elements (not shown) may be embedded or may surround components of chamber lid assembly 632 to heat chamber lid assembly 632. In one embodiment, components of chamber lid assembly 632 may be individually heated or cooled. For example, chamber lid assembly 632 may contain lid plate 670 and lid cap 672 in which lid plate 670 and lid cap 672 form expanding channel 634. Lid cap 672 may be maintained at one temperature range and lid plate 670 may be maintained at another temperature range. For example, lid cap 672 may be heated by being wrapped in heater tape or by using another heating device to prevent condensation of reactant gases and lid plate 670 may be maintained at ambient temperature. In another example, lid cap 672 may be heated and lid plate 670 may be cooled with water channels formed therethrough to prevent thermal decomposition of reactant gases on lid plate 670.

Chamber lid assembly 632 contains components that may be made of stainless steel, aluminum, nickel-plated aluminum, nickel, or other suitable materials compatible with the processing to be performed. In one embodiment, lid cap 672 contains aluminum or stainless steel and lid plate 670 contains aluminum.

Control unit 280, such as a programmed personal computer, work station computer, or the like, may be coupled to the process chamber 106 to control processing conditions. For example, control unit 680 may be configured to control flow of various process gases and purge gases from gas sources 638, 639, and 640 through valves 642a, 262b during different stages of a substrate process sequence. Illustratively, the control unit 680 contains central processing unit (CPU) 682, support circuitry 684, and memory 686 containing associated control software 683.

The control unit 680 may be one of any form of general purpose computer processor that can be used in an industrial setting for controlling various chambers and sub-processors. The CPU 682 may use any suitable memory 686, such as random access memory, read only memory, floppy disk drive, hard disk, or any other form of digital storage, local or remote. Various support circuits may be coupled to the CPU 682 for supporting process chamber 106. The control unit 680 may be coupled to another controller that is located adjacent individual chamber components, such as programmable logic controllers 648a, 648b of valves 642a, 642b. Bi-directional communications between the control unit 680 and various other components of process chamber 106 are handled through numerous signal cables collectively referred to as signal buses 688. In addition to control of process gases and purge gases from gas sources 638, 639, 640 and from programmable logic controllers 648a, 648b of valves 642a, 642b, control unit 680 may be configured to be responsible for automated control of other activities used in wafer processing-such as wafer transport, temperature control, chamber evacuation, among other activities.

In operation, the substrate 610 is delivered to the process chamber 106 through the slit valve 608 by a robot (not shown), such as the transfer robot 114 (FIG. 1). Substrate 610 is positioned on substrate support 612 through cooperation of the lift pins 620 and the robot. Substrate support 612 raises substrate 610 into close opposition to lower surface 660 of chamber lid assembly 632. A first gas flow may be injected into expanding channel 634 of process chamber 106 by valve 642a together or separately (i.e., pulses) with a second gas flow injected into process chamber 106 by valve 642b. The first gas flow may contain a continuous flow of a purge gas from purge gas source 640 and pulses of a reactant gas from reactant gas source 638 or may contain pulses of a reactant gas from reactant gas source 638 and pulses of a purge gas from purge gas source 640. The second gas flow may contain a continuous flow of a purge gas from purge gas source 640 and pulses of a reactant gas from reactant gas source 639 or may contain pulses of a reactant gas from reactant gas source 639 and pulses of a purge gas from purge gas source 640. The gas flow travels through expanding channel 634 as a pattern of vortex flow which provides a sweeping action across the inner surface of expanding channel 634. The pattern of vortex flow dissipates to a downwardly flow toward the surface of substrate 610. The velocity of the gas flow reduces as it travels through expanding channel 634. The gas flow then travels across the surface of substrate 610 and across lower surface 660 of chamber lid assembly 632. Lower surface 660 of chamber lid assembly 632, which is downwardly sloping, helps reduce the variation of the velocity of the gas flow across the surface of substrate 610. The gas flow then travels by choke 662 and into pumping zone 666 of process chamber 106. Excess gas, by-products, etc. flow into the pumping channel 679 and are then exhausted from process chamber 106 by vacuum system 678. In one aspect, the gas flow proceeds through expanding channel 634 and between the surface of substrate 610 and lower surface 660 of chamber lid assembly 632 in a laminar manner which aids in uniform exposure of a reactant gas to the surface of substrate 610 and efficient purging of inner surfaces of chamber lid assembly 632.

Figure 7:
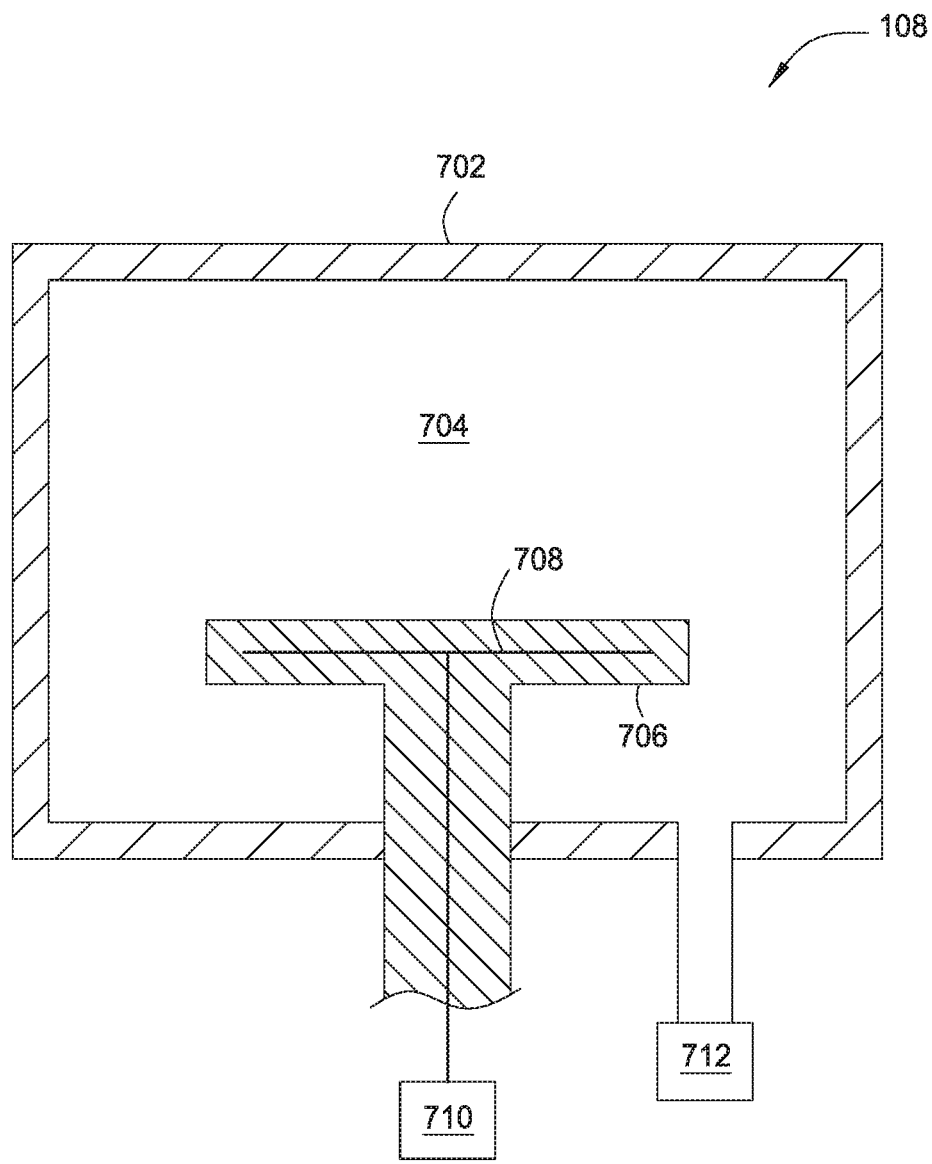
FIG. 7 illustrates a schematic, cross-sectional view of a process chamber according to one embodiment described herein.

FIG. 7 illustrates a schematic, cross-sectional view of the process chamber 108 according to one embodiment described herein. In one embodiment, the process chamber 108 is similar to the process chamber 102. In this embodiment, the process chamber 108 may be utilized for thermal post-ALD treatment, plasma post-ALD treatment, or a combination thereof. For embodiments utilizing a plasma post-ALD treatment, a plasma etch process may be performed to remove ALD material from undesired locations on the substrate. It is contemplated that the plasma etch process may be utilized if an imperfect SAM treatment resulted in undesired areas of the substrate remaining exposed during ALD treatment.

In another embodiment, the process chamber 108 is different from the process chamber 102. A different chamber is illustrated in FIG. 7 having a chamber body 702 defining a process volume 704. A substrate support 706 is disposed within the process volume 704 and a heater 708, such as a resistive heater, is disposed within the substrate support 706. The heater 708 is coupled to a power source 710 and the heater is configured to heat a substrate disposed on the substrate support 706 to a temperature greater than a vaporization temperature of SAM materials disposed on the substrate. Thus, the process chamber 108 volatilizes SAM materials from the substrate and the volatilized materials are exhausted from the process volume 704 via an exhaust.

Figure 8:
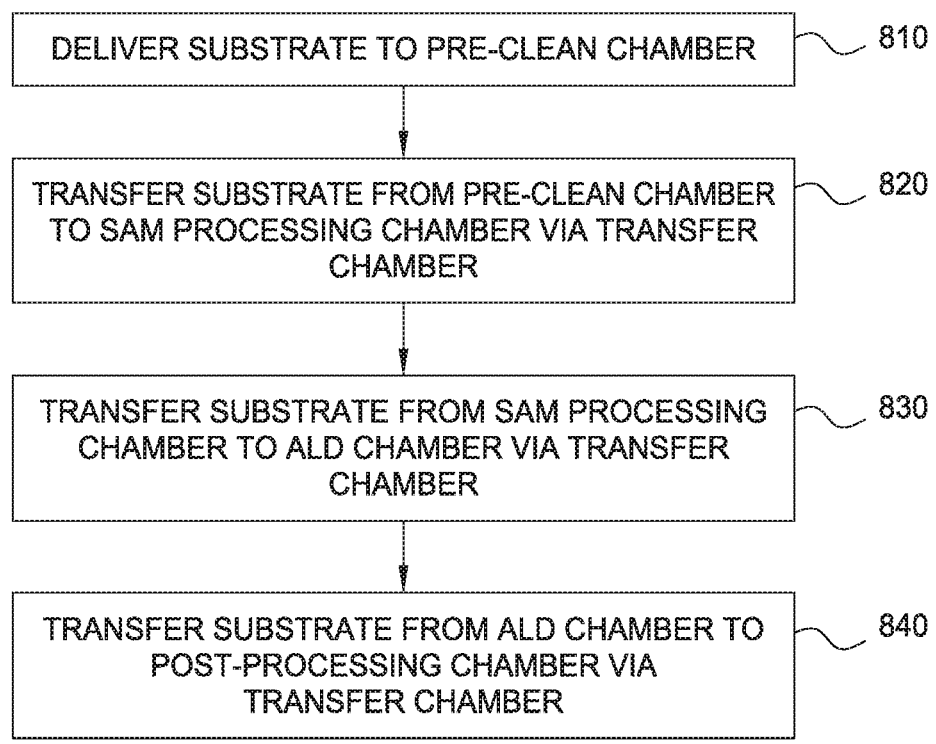
FIG. 8 illustrates operations of a method for processing a substrate according to one embodiment described herein.

FIG. 8 illustrates operations of a method 800 for processing a substrate according to one embodiment described herein. At operation 810, a substrate is delivered to a pre-clean chamber, such as process chamber 102. A pre-clean process is performed on the substrate and the substrate is transferred from the pre-clean chamber to a SAM processing chamber, such as process chamber 104, via a transfer chamber (i.e. transfer chamber 110) at operation 820.

A SAM material deposition process is performed on the substrate and at operation 830, the substrate is transferred from the SAM processing chamber to an ALD chamber, such as process chamber 106, via the transfer chamber. An ALD process is performed on the substrate and the substrate is transferred from the ALD chamber to a post-processing chamber, such as process chamber 108, via the transfer chamber at operation 840. Post-processing is performed on the substrate and the substrate may be transferred from the post-processing chamber for subsequent processing.

In summation, the integrated cluster tool apparatus provides for improved in-situ processing and increased throughput when utilizing SAM treatment processes in combination with subsequent deposition processes, such as ALD treatments. Additional process capability, such as pre and post processing of substrates, provides various advantages, such as improved material deposition selectivity, in accordance with embodiments described herein.

While the foregoing is directed to embodiments of the present disclosure, other and further embodiments of the disclosure may be devised without departing from the basic scope thereof, and the scope thereof is determined by the claims that follow.

What is claimed is:

1. A substrate processing method, comprising:
transferring a substrate to a first process chamber and performing a surface modification process on a surface of the substrate in the first process chamber, the surface including a first portion comprising metal and a second portion comprising dielectric material;
transferring the substrate from the first process chamber to a second process chamber via a transfer chamber, and disposing the substrate in a process volume of the second process chamber, the second process chamber comprising:
a chamber body;
a substrate support disposed in the chamber body;
a lid plate coupled to the chamber body;
a heater disposed in the chamber body, opposite from the substrate support, wherein the process volume is defined between the substrate support and the heater;
an annular manifold coupled to the chamber body radially outward of the substrate support and the heater, the annular manifold further defining the process volume; and
an injection assembly coupled to the lid plate radially outward of the process volume in fluid communication with the process volume through the annular manifold;
performing a self-assembled monolayer treatment process on the substrate in the second process chamber to form a self-assembled monolayer on the first portion of the substrate where sections of the first portion of the substrate are not covered by the self-assembled monolayer, wherein the self-assembled monolayer treatment process comprises:
vaporizing a liquid in a vaporizer mounted to the lid plate of the second process chamber to generate a vaporized self-assembled monolayer precursor;
directing the vaporized self-assembled monolayer precursor to the process volume of the second process chamber through the lid plate, and then through a thermal insulator, and then into the annular manifold, via the injection assembly, the injection assembly includes an injector surrounded by a heater jacket extending between the vaporizer and the lid plate; and
providing a cross-flow type exposure of the vaporized self-assembled monolayer precursor to the process volume between the substrate support and the heater via the injection assembly in the second process chamber;
transferring the substrate from the second process chamber to a third process chamber via the transfer chamber;
performing an atomic layer deposition process on the substrate in the third process chamber to form an atomic layer on the second portion of the substrate and the sections of the first portion of the substrate not covered by the self-assembled monolayer;
transferring the substrate from the third process chamber to a fourth process chamber via the transfer chamber; and
performing an anneal process on the substrate in the fourth process chamber.

2. The method of claim 1, wherein the transfer chamber is maintained under vacuum during each of the substrate transfer processes.

3. The method of claim 1, wherein the anneal process is performed at a temperature greater than a vaporization temperature of a self-assembled monolayer material.

4. The method of claim 1, wherein the surface modification process is a pre-clean process.

5. The method of claim 4, wherein the pre-clean process modifies surface terminal groups on the substrate.

6. The method of claim 1, wherein each of the first process chamber, the second process chamber, the third process chamber, and the fourth process chamber is coupled to the transfer chamber.

7. The method of claim 1, wherein the metal comprises Cu and the dielectric material comprises $SiO_2$.

8. The method of claim 1, further comprising an etch process performed after the atomic layer deposition process, the etch process removing the atomic layer deposited on the sections of the first portion of the substrate that are not covered by the self-assembled monolayer.

9. The method of claim 1, further comprising:
a vapor generation assembly in fluid communication with the injection assembly and the process volume.

10. A substrate processing method, comprising:
performing a surface modification process on a surface of a substrate in a first process chamber, the surface of the substrate including a first portion comprising metal and a second portion comprising dielectric material, wherein the surface modification process removes defects from the substrate;
transferring the substrate from the first process chamber to a second process chamber via a transfer chamber, and disposing the substrate in a process volume of the second process chamber, the second process chamber comprising:
a chamber body;
a substrate support disposed in the chamber body;
a lid plate coupled to the chamber body;
a heater disposed in the chamber body, opposite from the substrate support, wherein the process volume is defined between the substrate support and the heater;
an annular manifold coupled to the chamber body radially outward of the substrate support and the heater, the annular manifold further defining the process volume; and
an injection assembly coupled to the lid plate radially outward of the process volume in fluid communication with the process volume through the annular manifold;
performing a self-assembled monolayer treatment process on the substrate to form a self-assembled monolayer on the first portion of the substrate where sections of the first portion of the substrate are not covered by the self-assembled monolayer, in the second process chamber, wherein the self-assembled monolayer treatment process comprises:
vaporizing a liquid in a vaporizer mounted to the lid plate of the second process chamber to generate a vaporized self-assembled monolayer precursor;
directing the vaporized self-assembled monolayer precursor to the process volume of the second process chamber through the lid plate, and then through a thermal insulator, and then into the annular manifold, via the injection assembly, the injection assembly includes an injector surrounded by a heater jacket extending between the vaporizer and the lid plate; and
providing a cross-flow type exposure of the vaporized self-assembled monolayer precursor to the process volume between the substrate support and the heater via the injection assembly in the second process chamber;
transferring the substrate from the second process chamber to a third process chamber via the transfer chamber;
performing an atomic layer deposition process on the substrate to form an atomic layer on the second portion of the substrate and the sections of the first portion of the substrate not covered by the self-assembled monolayer, in the third process chamber;
transferring the substrate from the third process chamber to a fourth process chamber via the transfer chamber; and
performing an etch process on the substrate in the fourth process chamber, the etch process removing the atomic layer deposited on the sections of the first portion of the substrate that is not covered by the self-assembled monolayer.

11. The method of claim 10, wherein the transfer chamber is maintained under vacuum during each of the substrate transfer processes.

12. The method of claim 10, further comprising an anneal process performed after the atomic layer deposition process, wherein the anneal process is performed at a temperature greater than a vaporization temperature of a self-assembled monolayer material.

13. The method of claim 10, wherein the surface modification process is a pre-clean process.

14. The method of claim 10, wherein each of the first process chamber, the second process chamber, the third process chamber, and the fourth process chamber is coupled to the transfer chamber.

15. The method of claim 10, wherein the metal comprises Cu and the dielectric material comprises $SiO_2$.

16. A substrate processing method, comprising:
performing a surface modification process on a substrate in a first process chamber, a surface of the substrate including a first portion comprising metal and a second portion comprising dielectric material, wherein the surface modification process removes defects from the substrate;
transferring the substrate from the first process chamber to a second process chamber via a transfer chamber and disposing the substrate in a process volume of the second process chamber,
the second process chamber comprising:
a chamber body;
a substrate support disposed in the chamber body;
a lid plate coupled to the chamber body;
a heater disposed in the chamber body, opposite from the substrate support, wherein the process volume is defined between the substrate support and the heater;
an annular manifold coupled to the chamber body radially outward of the substrate support and the heater, the annular manifold further defining the process volume; and
an injection assembly coupled to the lid plate radially outward of the process volume in fluid communication with the process volume through the annular manifold;
performing a self-assembled monolayer treatment process on the substrate to form a self-assembled monolayer on the first portion of the substrate where sections of the first portion of the substrate are not covered by the self-assembled monolayer, in the second process chamber, wherein the self-assembled monolayer treatment process comprises:
vaporizing a liquid in a vaporizer mounted to the lid plate of the second process chamber to generate a vaporized self-assembled monolayer precursor;
directing the vaporized self-assembled monolayer precursor to the process volume of the second process chamber through the lid plate, and then through a thermal insulator, and then into the annular manifold, via the injection assembly, the injection assembly includes an injector surrounded by a heater jacket extending between the vaporizer and the lid plate; and
providing a cross-flow type exposure of the vaporized self-assembled monolayer precursor to the process volume between the substrate support and the heater via the injection assembly in the second process chamber, wherein the vaporized self-assembled monolayer precursor is selected from the group consisting of thiol materials, silylamine materials, chlorosilane materials, and oxysilane materials;
transferring the substrate from the second process chamber to a third process chamber via the transfer chamber;

performing an atomic layer deposition process on the substrate to form an atomic layer on the second portion of the substrate and the sections of the first portion of the substrate not covered by the self-assembled monolayer, in the third process chamber;

transferring the substrate from the third process chamber to a fourth process chamber via the transfer chamber; and performing an anneal process on the substrate in the fourth process chamber to remove material from the substrate deposited during the self-assembled monolayer treatment process.

17. The method of claim 16, wherein the transfer chamber is maintained under vacuum during each of the substrate transfer processes.

18. The method of claim 16, wherein the anneal process is performed at a temperature greater than a vaporization temperature of the self-assembled monolayer precursors.

19. The method of claim 16, wherein the surface modification process is a pre-clean process which modifies surface terminal groups on the substrate.

20. The method of claim 16, wherein the metal comprises Cu and the dielectric material comprises $SiO_2$.

21. The method of claim 16, further comprising an etch process performed after the atomic layer deposition process, the etch process removing the atomic layer deposited on the sections of the first portion of the substrate that are not covered by the self-assembled monolayer.

* * * * *